United States Patent [19]

Nanbu et al.

[11] Patent Number: 4,733,372

[45] Date of Patent: Mar. 22, 1988

[54] SEMICONDUCTOR MEMORY HAVING REDUNDANCY

[75] Inventors: Hiroaki Nanbu, Hachioji; Kunihiko Yamaguchi, Sayama; Noriyuki Honma, Kokubunji; Kazuo Kanetani, Kokubunji; Motoaki Matumoto, Kokubunji; Kazuhiko Tani, Kokubunji; Kenichi Ohata, Kokubunji, all of Japan

[73] Assignees: Hitachi, Ltd.; Hitachi Device Eng., both of Tokyo, Japan

[21] Appl. No.: 893,930

[22] Filed: Aug. 6, 1986

[30] Foreign Application Priority Data

Aug. 23, 1985 [JP] Japan .................................. 60-184242
Aug. 23, 1985 [JP] Japan .................................. 60-184241
Nov. 27, 1985 [JP] Japan .................................. 60-264895

[51] Int. Cl.$^4$ .............................................. G11C 8/00
[52] U.S. Cl. ..................................... 365/200; 365/96; 365/179
[58] Field of Search ................. 365/96, 200, 210, 155, 365/177, 179; 371/10, 21

[56] References Cited

U.S. PATENT DOCUMENTS 3,872,450  3/1975  Reynolds ............................. 365/96
4,101,974  7/1978  Immer et al. ........................ 365/96
4,586,169  4/1986  Itoh et al. ........................... 365/49

Primary Examiner—James W. Moffitt
Attorney, Agent, or Firm—Antonelli, Terry & Wands

[57] ABSTRACT

Herein disclosed is a bipolar memory having redundancy, which can be produced with a small area. In this semiconductor memory having a body memory for storing data and a spare memory for relief of fault bit of the body memory, a row is selected by cutting fuses in a decoder. Fundamentally signal lines such as word lines are not provided with fuses. Other parts including a power source and a reference voltage source are provided with fuses without decreasing the operating speed accompanied by only a slight increase in the area.

14 Claims, 39 Drawing Figures

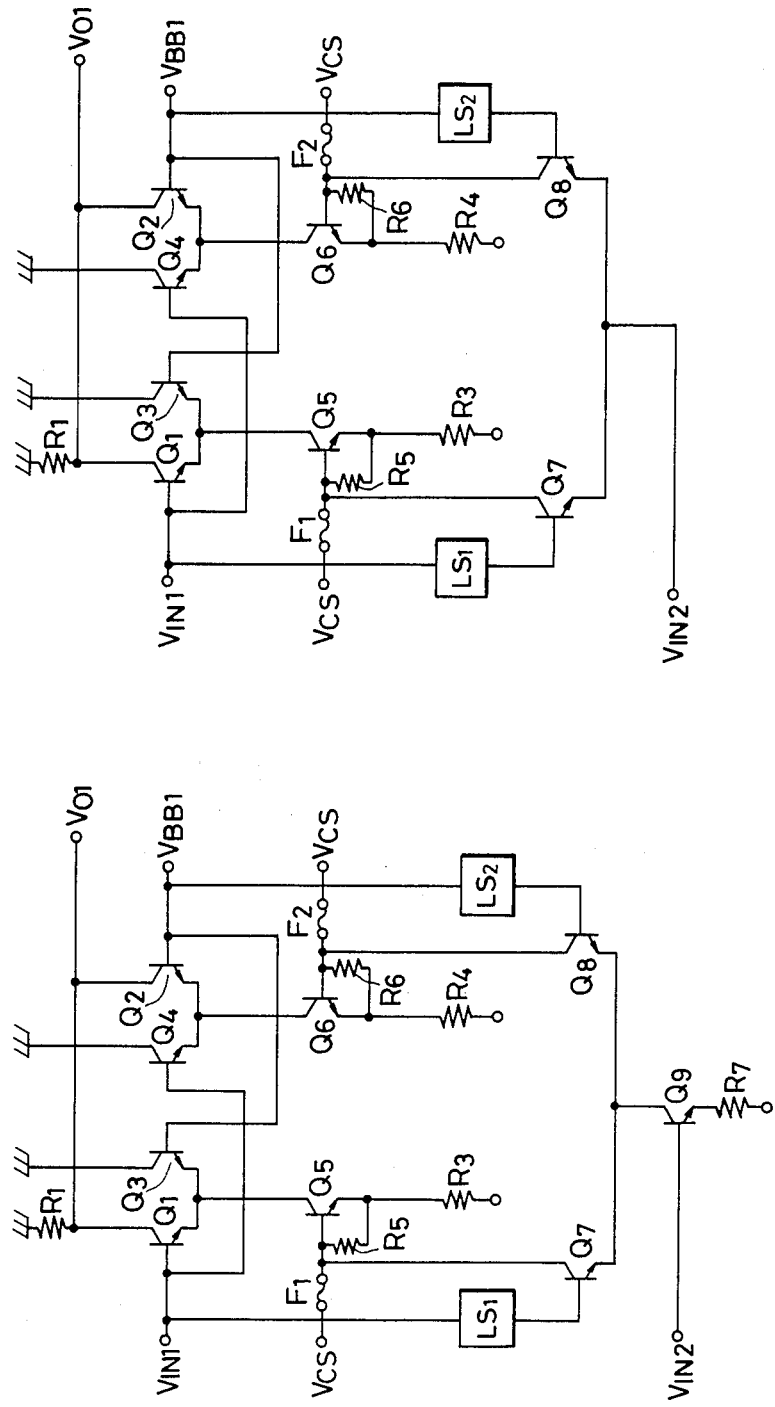

SEMICONDUCTOR MEMORY HAVING REDUNDANCY

BACKGROUND OF THE INVENTION

The present invention relates to a semiconductor memory having redundancy and, more particularly, to a semiconductor memory suited for high-level integration.

In the semiconductor memory having redundancy according to the prior art, an address compare method has been employed, as is discussed in ISSCC (1985) "Digest of Technical Papers", pp. 48 to 49, "64 Kb ECL RAM with Redundancy". This address compare method will be described in the following with reference to FIG. 1.

FIG. 1 shows a structure of a semiconductor memory having redundancy employing the address compare method. An X-address signal and a Y-address signal are decoded by an X-decoder 101 and a Y-decoder 102, respectively, so that one of memory cells is selected from a memory cell array 105. A read data from the memory cell selected is sensed by a sense circuit 107 so that output data D/O is outputted. In case a fault memory cell is found in the memory cell array 105, on the other hand, address data for selecting the fault memory cell is written in a PROM (which is the abbreviation of Programmable Read Only Memory) 104. Then, the address data inputted and the address data coming from the PROM 104 for selecting the fault memory cell are compared by an address comparator 103. In order that the memory cell array may not be selected when the two address data are coincident, a select prohibition signal SD is outputted to the decoder 101, and at the same time a spare word line 106 is selected to relieve the fault bit. Incidentally, FIG. 1 shows only the spare word line 106, but a spare bit line may also be provided in a column direction.

According to the address compare method, however, an (m×n) number of address comparators and PROMs have to be provided if the number of the address inputs in the row (or column) direction is designated at m whereas the number of the rows (or columns) of the spare rows (or columns) is designated at n. As a result, the address compare method obstructs the high-level integration due to its large power dissipation and chip size.

In Japanese Patent Laid-Open No. 57-198599, on the other hand, there is also disclosed a memory having redundancy. This technique has failed to give positive treatment to the fault bit word lines so that it has been unable to prevent other cells from being adversely affected. Since the redundant program has been executed by the signal lines leading to the word lines, moreover, the high-speed action has been obstructed by the accordingly high resistance.

SUMMARY OF THE INVENTION

An object of the present invention is to provide a fault relieving circuit which can suppress the increase in the chip area of a bipolar ECL RAM having redundancy.

Another object of the present invention is to provide a memory which is freed from having its operating speed delayed even if it is equipped with the fault relieving circuit.

Another object of the present invention is to provide a memory of which the operation stability is not decreased though it has a fault relieving circuit.

In order to achieve the above-specified objects, according to the present invention, a redundant row (or column) is selected when a fault row (or column) is to be selected, by adding fuses to a decoder and by cutting the fuses. These fuses are not basically provided for lines which will exert direct influences upon the operating speed, such as lines for driving word lines.

There is also provided low clamp means for preventing the fault word lines from electrically floating, after the fault row has always been unselected, thereby to prevent the voltage from floating. As a result, the increase in the chip area is limited to a remarkably small amount, i.e., to the addition of the aforementioned programmable elements.

Moreover, the address compare circuit and the PROM, which are required of the aforementioned address compare method, can be dispensed with to make the high-level integration possible.

Still moreover, the fault row is fixed at such a low voltage as not to adversely effect the other rows.

These and other objects and many of the attendant advantages of the present invention will be readily appreciated as the same becomes better understood by reference to the following detailed description when considered in connection with the accompanying drawings.

BRIEF DESCRIPTION OF THE DRAWINGS

FIGS. 2 to 19 are circuit diagrams showing embodiments 1 to 17 of the present invention, respectively;

DESCRIPTION OF THE PREFERRED EMBODIMENTS

Figure 1:
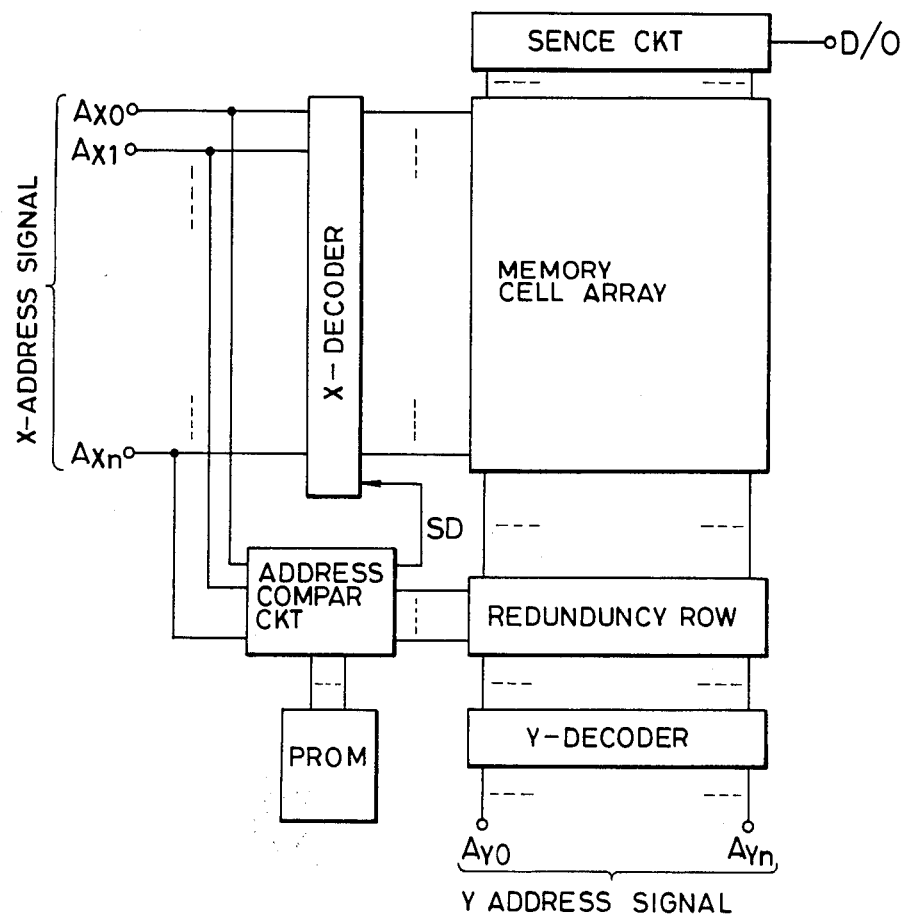
FIG. 1 is a block diagram showing the memory having redundancy according to the prior art.

The present invention will be described in detail in the following in connection with the embodiments thereof. These embodiments are divided into three groups. The group 1 consists of the embodiments 1 to 17, in which fuses are disposed at the portion of a constant current source. The group 2 consists of the embodiments 18 to 26, in which fuses are disposed at a reference voltage input portion or an address input portion. The group 3 consists of the embodiments 27 to 32, in which fuses are disposed on the drive lines of a word line driver and which is equipped with low clamp means. The embodiments belonging to the groups 1 and 3 can be practised in combination. The embodiments of the group 2 are enabled to achieve the effects obtainable from those of the group 3 by cutting the fuses. This makes it unnecessary to combine the embodiments of the group 2 with those of the group 3. However, the embodiments of the groups 2 and 3 may naturally be combined. In this case, one of the overlapped means of the two groups may preferably be omitted according to the common sense of those skilled in the art.

(GROUP 1)

Embodiment 1

Figure 2:
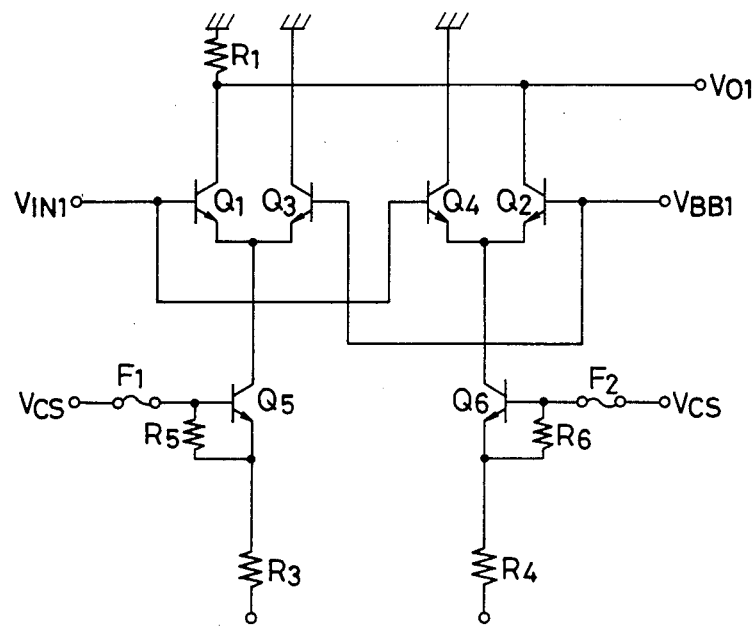

Referring to FIG. 2, there is shown the first embodiment, which is constructed of: a resistor $R_1$, transistors $Q_1$ and $Q_4$ which have their bases fed with an address input signal $V_{IN1}$; transistors $Q_2$ and $Q_3$ which have their bases fed with a reference voltage $V_{BB1}$; and transistors $Q_5$ and $Q_6$ which have their emitters connected with resistors $R_3$ and $R_4$, respectively. These components construct together a compare gate for extracting from the collector of the transistor $Q_1$ a signal for bringing a fault row (or column) into an unselected state and a redundant row (or column) into a selected state. Fuses $F_1$ and $F_2$ and high resistors $R_5$ and $R_6$ are additionally connected between the bases of the transistors $Q_5$ and $Q_6$ and a voltage source $V_{CS}$ and between the bases and emitters of the same transistors. Now, if the fuses $F_1$ and $F_2$ are conductive, the transistors $Q_5$ and $Q_6$ are turned on, because their bases are connected with the voltage source $V_{CS}$, to supply a constant current to current switches which are composed of the transistors $Q_1$ and $Q_3$ and the transistors $Q_4$ and $Q_2$, respectively. Here, if the address input signal $V_{IN1}$ is at a high level, the transistors $Q_1$ and $Q_4$ of the aforementioned current switches are turned on so that the current flowing through the transistor $Q_5$ will flow through the transistor $Q_1$ to the resistor $R_1$ to drop an output $V_{01}$ to a low level. If the input signal $V_{IN1}$ is at the low level, the current of the transistor $Q_6$ will also flow through the transistor $Q_2$ to the resistor $R_1$ to drop the output $V_{01}$ to the low level. Now, it is assumed that the address input signal $V_{IN1}$ corresponding to a fault row (or column) is at the high level, and it is intended that the output $V_{01}$ is raised to the high level so that the fault row (or column) may be brought into the unselected state whereas the redundant-row (or column) may be brought into the selected state when the address input signal $V_{IN1}$ is at the high level. In this case, it is sufficient to cut the fuse $F_1$ by means of a laser beam. Since, at this time, no base current is supplied to the transistor $Q_5$ from the voltage source $V_{CS}$, the transistor $Q_5$ is cut off to supply no current to the current switch composed of the transistors $Q_1$ and $Q_3$. As a result, as has been described above, the output $V_{01}$ takes the low level, when the address input signal $V_{IN1}$ is at the low level, but takes the high level when the input signal $V_{IN1}$ is at the high level. It is apparent from the symmetry of the circuit that the fuse $F_2$ may be cut in case the level of the address input signal $V_{IN1}$ corresponding to the fault row (or column) is low. Incidentally, the resistors $R_5$ and $R_6$ are added to set the base voltages of the transistors $Q_5$ and $Q_6$ at the same levels of the emitters thereby to prevent the base voltages from floating but are not necessarily indispensable.

EMBODIMENT 2

Figure 3:
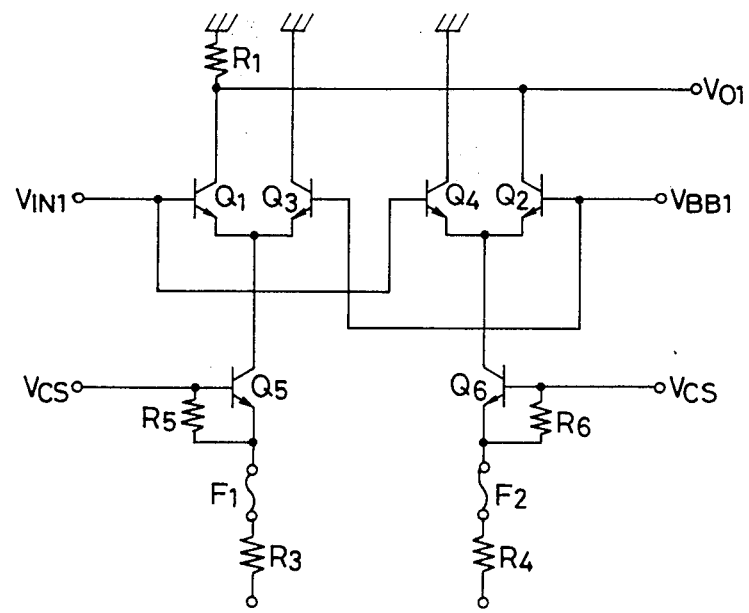

FIG. 3 shows the second embodiment according to the fundamental concept of the present invention. Although, in the embodiment of FIG. 2, the fuses $F_1$ and $F_2$ are added to the bases of the transistors $Q_5$ and $Q_6$, the embodiment of FIG. 3 is different therefrom only in that the fuses $F_1$ and $F_2$ are added to the emitters of the transistors $Q_5$ and $Q_6$. Since, in the case of this embodiment, the transistor $Q_5$ or $Q_6$ is cut off if the fuse $F_1$ or $F_2$ is cut, the subsequent circuit operations are absolutely the same as those of the embodiment of FIG. 2.

Embodiment 3

Figure 4:
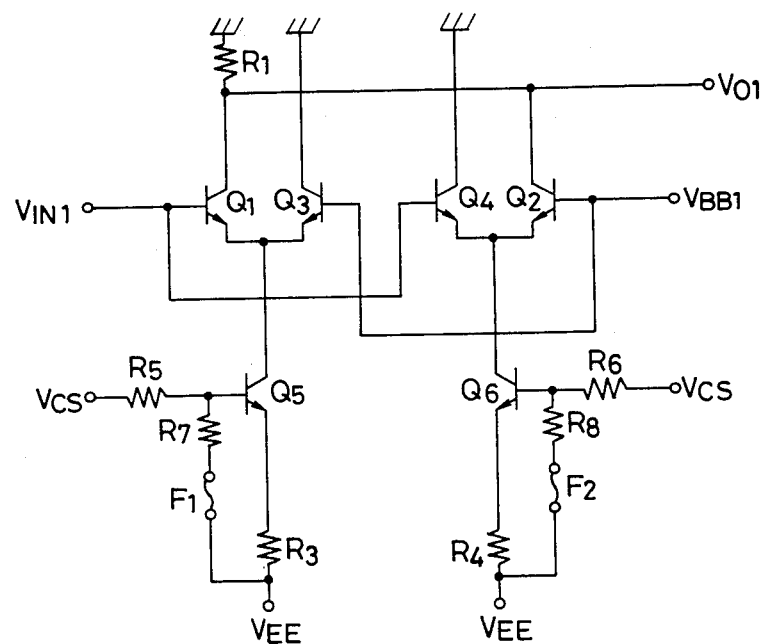

FIG. 4 shows the third embodiment according to the fundamental concept of the present invention. In the foregoing embodiments of FIGS. 2 and 3, the output $V_{01}$ is raised to the high level so as to bring the fault row (or column) into the unselected state and the redundant row (or column) into the selected state when the address input signal $V_{IN1}$ corresponding to the fault row (or column) is inputted. In the embodiment of FIG. 4, on the contrary, the aforementioned output $V_{01}$ is dropped to the low level. In the embodiment of FIG. 2, therefore, the fuses $F_1$ and $F_2$ are additionally connected between the bases of the transistors $Q_5$ and $Q_6$ and the voltage source $V_{CS}$. In the embodiment of FIG. 4, on the contrary, the fuses $F_1$ and $F_2$ are added between the bases of the transistors $Q_5$ and $Q_6$ and a power source $V_{EE}$. Here, the resistors $R_5$ and $R_7$, and $R_6$ and $R_8$ are resistors for level shift, i.e., resistors for cutting off the transistors $Q_5$ and $Q_6$ by making their base voltages lower than $V_{CS}$ when the fuses $F_1$ and $F_2$ are conductive. If the fuses are added as in the embodiment of FIG. 4, the transistors $Q_5$ and $Q_6$ are cut off contrary to the case of the embodiments of FIGS. 2 and 3, when the fuses $F_1$ and $F_2$ are conductive, to supply no current to the current switches composed of the transistors $Q_1$ and $Q_3$, and $Q_2$ and $Q_4$ so that the output $V_{01}$ takes the high level no matter what level the address signal $V_{IN1}$ might take. When the fuse $F_1$ is cut, on the contrary, the transistor $Q_5$ is turned on so that the output $V_{01}$ can be dropped to the low level when the input signal $V_{IN1}$ is at the high level. When the fuse $F_2$ is cut, on the contrary, the transistor $Q_6$ is turned on so that the output $V_{01}$ can be dropped to the low level when the input signal $V_{IN1}$ is at the low level.

Embodiment 4

Figure 5:
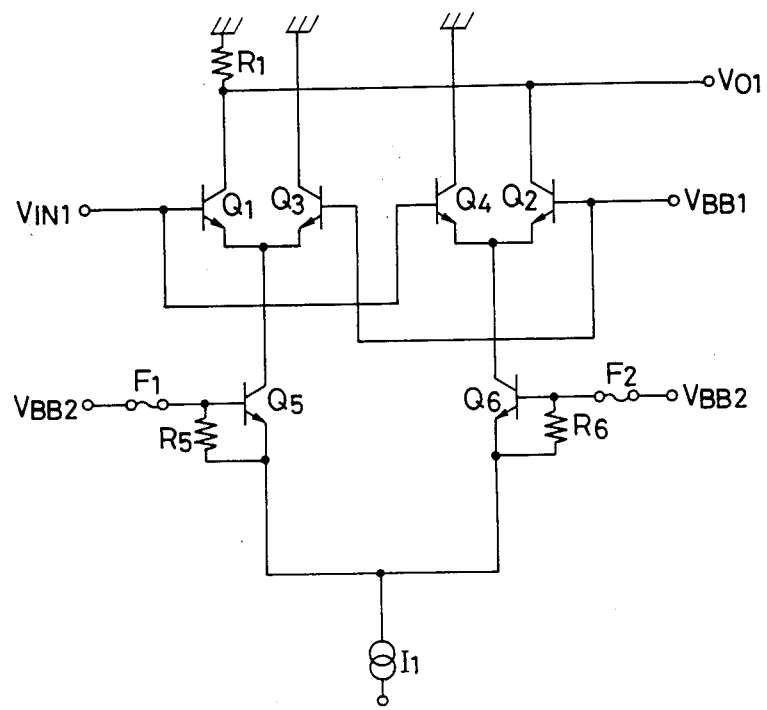

FIG. 5 shows the fourth embodiment according to the fundamental concept of the present invention. The embodiment of FIG. 5 is different from that of FIG. 2, in which the resistors $R_3$ and $R_4$ are connected with the emitters of the transistors $Q_5$ and $Q_6$, only in that a current source $I_1$ is connected commonly with the emitters of the transistors $Q_5$ and $Q_6$. Since, in this embodiment, the transistor $Q_5$ or $Q_6$ is cut off if the fuse $F_1$ or $F_2$ is cut, the subsequent circuit operations are absolutely the same as those of the embodiment of FIG. 2.

Embodiment 5

Figure 6:
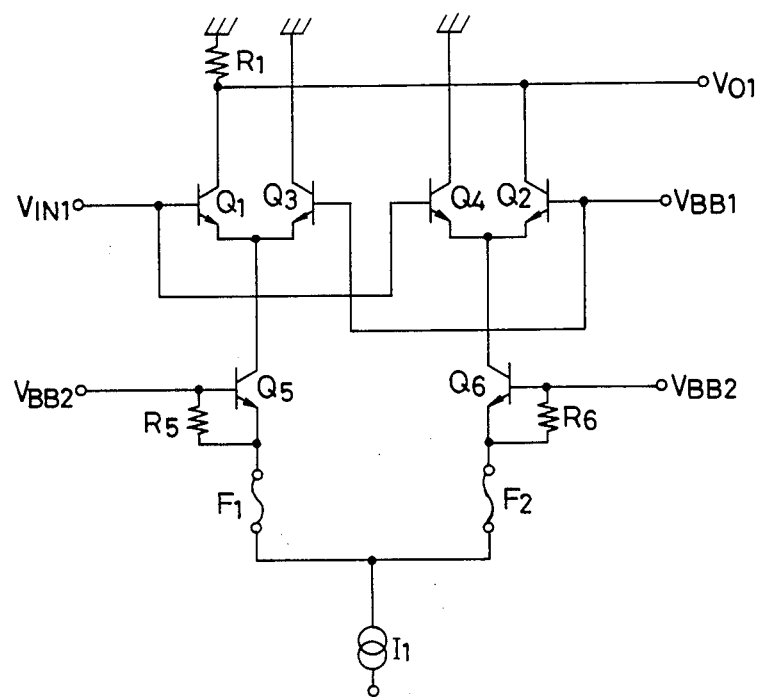

FIG. 6 shows the fifth embodiment according to the fundamental concept of the present invention. The embodiment of FIG. 6 is different from that of FIG. 5, in which the fuses $F_1$ and $F_2$ are additionally connected with the bases of the transistors $Q_5$ and $Q_6$, only in that the fuses $F_1$ and $F_2$ are additionally connected with the emitters of the transistors $Q_5$ and $Q_6$, but have absolutely the same operations as those of the embodiment of FIG. 5.

Embodiment 6

Figure 7:
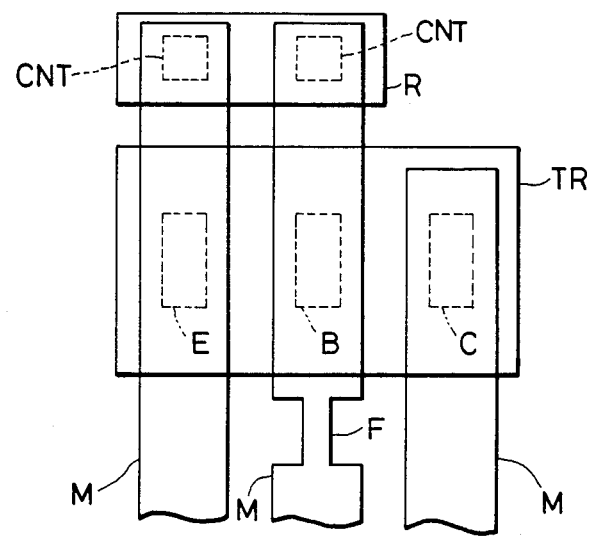

FIG. 7 is a diagram showing the sixth embodiment of the present invention and a layout showing a method of adding a fuse to the base of a transistor and a resistor between the base and emitter of the same. In FIG. 7: reference letters TR designate a transistor; letters E an emitter; letter B a base; letter C a collector; letter R a resistor; letters CNT contacts; and letter M metals for signal lines. Here are designated at reference letter F fuses which use the signal line metals as they are. These signal line metals can be not only aluminum or poly-silicon but also tungsten, tantalum, molybdenum or platinum or their silicides.

Embodiment 7

Figure 8:
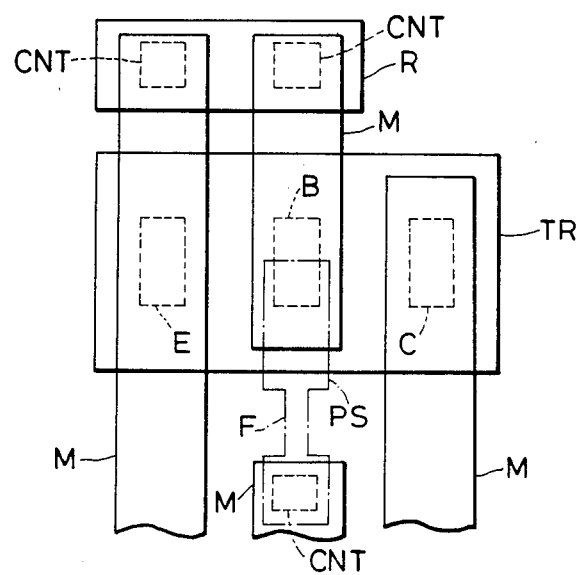

FIG. 8 is a diagram showing the seventh embodiment of the present invention and a layout showing a method of adding a fuse to the base of a transistor and a resistor between the base and emitter of the same, like the embodiment of FIG. 7. Although the fuses F are made of the signal line metals in the embodiment of FIG. 7, they are made of poly-silicon PS in the embodiment of FIG. 8.

Embodiment 8

Figure 9:
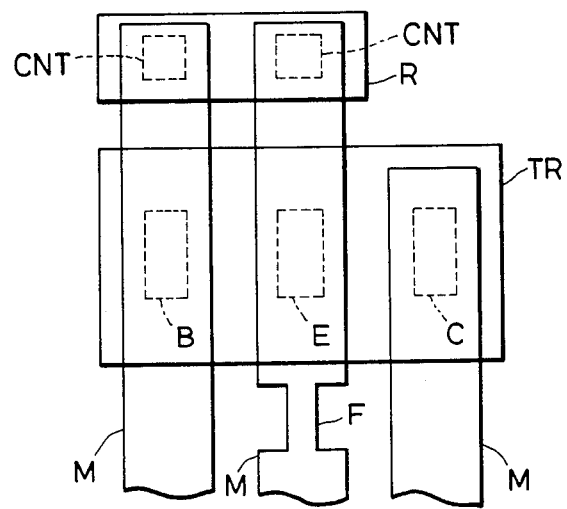

FIG. 9 is a diagram showing the eighth embodiment of the present invention and a layout showing a method of adding a fuse to the emitter of a transistor and a resistor between the base and emitter of the same, like the embodiments of FIGS. 3 and 4. Here, the fuse F uses the signal line metal as it is, like the embodiment of FIG. 7.

Embodiment 9

Figure 10:
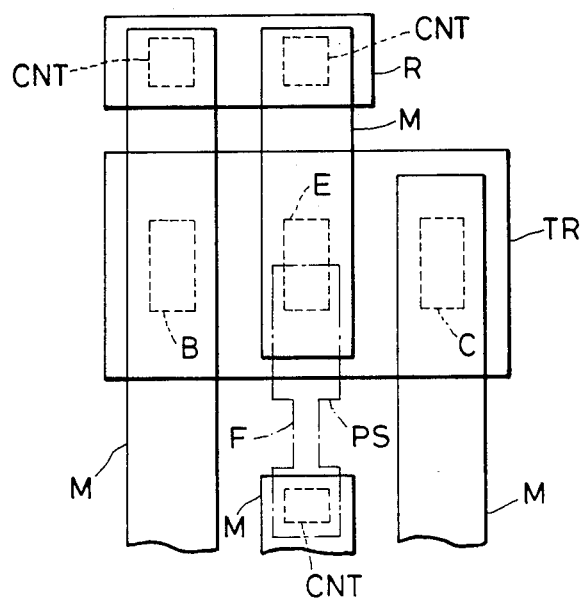

FIG. 10 is a diagram showing the ninth embodiment of the present invention and a layout showing a method of adding a fuse to the emitter of a transistor and a resistor between the base and emitter of the same, like the embodiment of FIG. 9. Here, the fuse F is made of poly-silicon PS like the embodiment of FIG. 8.

Embodiment 10

Figure 11:
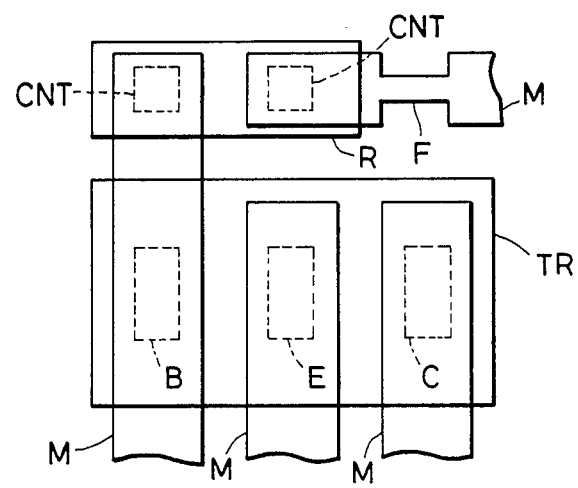

FIG. 11 is a diagram showing the tenth embodiment of the present invention and a layout showing a method adding a resistor and a fuse to the base of a transistor, as shown in FIG. 4. Here, the fuse F uses the signal line metal as it is, like the embodiment of FIG. 7.

Embodiment 11

Figure 12:
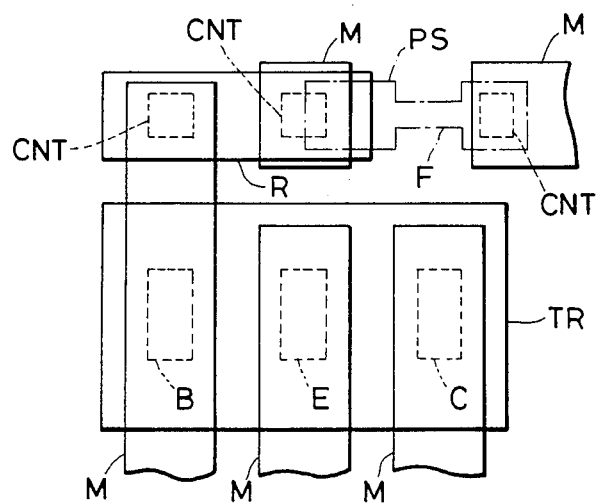

FIG. 12 is a diagram showing the eleventh embodiment of the present invention and a layout showing a method of a resistor and a fuse to the base of a transistor like the embodiment of FIG. 11. Here, the fuse is made of poly-silicon PS like the embodiment of FIG. 8.

Embodiment 12

FIG. 13 is a diagram showing the twelfth embodiment of the present invention and a layout showing a method of electrically realizing the cut of the fuse $F_1$ or $F_2$ shown in FIG. 2. Here, level shift circuits $LS_1$ and $LS_2$ subject the input signal $V_{IN1}$ and the reference potential $V_{BB}$, respectively, to the same level shift to supply them to the bases of transistors $Q_7$ and $Q_8$. Now, in case the address input signal $V_{IN1}$ corresponding to the fault row (or column) is at the high level, as has been described in connection with the embodiment of FIG. 2, and in case it is intended to cut the fuse $F_1$, the input signal $V_{IN1}$ as well as a fuse cutting input signal $V_{IN2}$ is raised to the high level. At this time, the transistors $Q_7$ and $Q_9$ are turned on so that a current flows through the fuse $F_1$. Here, if the magnitude of this current is set at such a proper value as to cut the fuse by adjusting the level of the input signal $V_{IN2}$ and the size of the resistor $R_7$, the fuse $F_1$ is instantly cut.

Embodiment 13

FIG. 14 is a circuit diagram showing the thirteenth embodiment of the present invention and a method of electrically realizing the cut of the fuse $F_1$ or $F_2$ shown in FIG. 2, like the embodiment of FIG. 13. In the embodiment of FIG. 14, the current source composed of the transistor $Q_9$ and the resistor $R_7$, as shown in FIG. 13, is eliminated, and the current is extracted directly from the input terminal $V_{IN2}$. With this construction, the circuitry can be simplified to an extent corresponding to the elimination of the transistor $Q_9$ and the resistor $R_7$.

Embodiment 14

Figure 15:
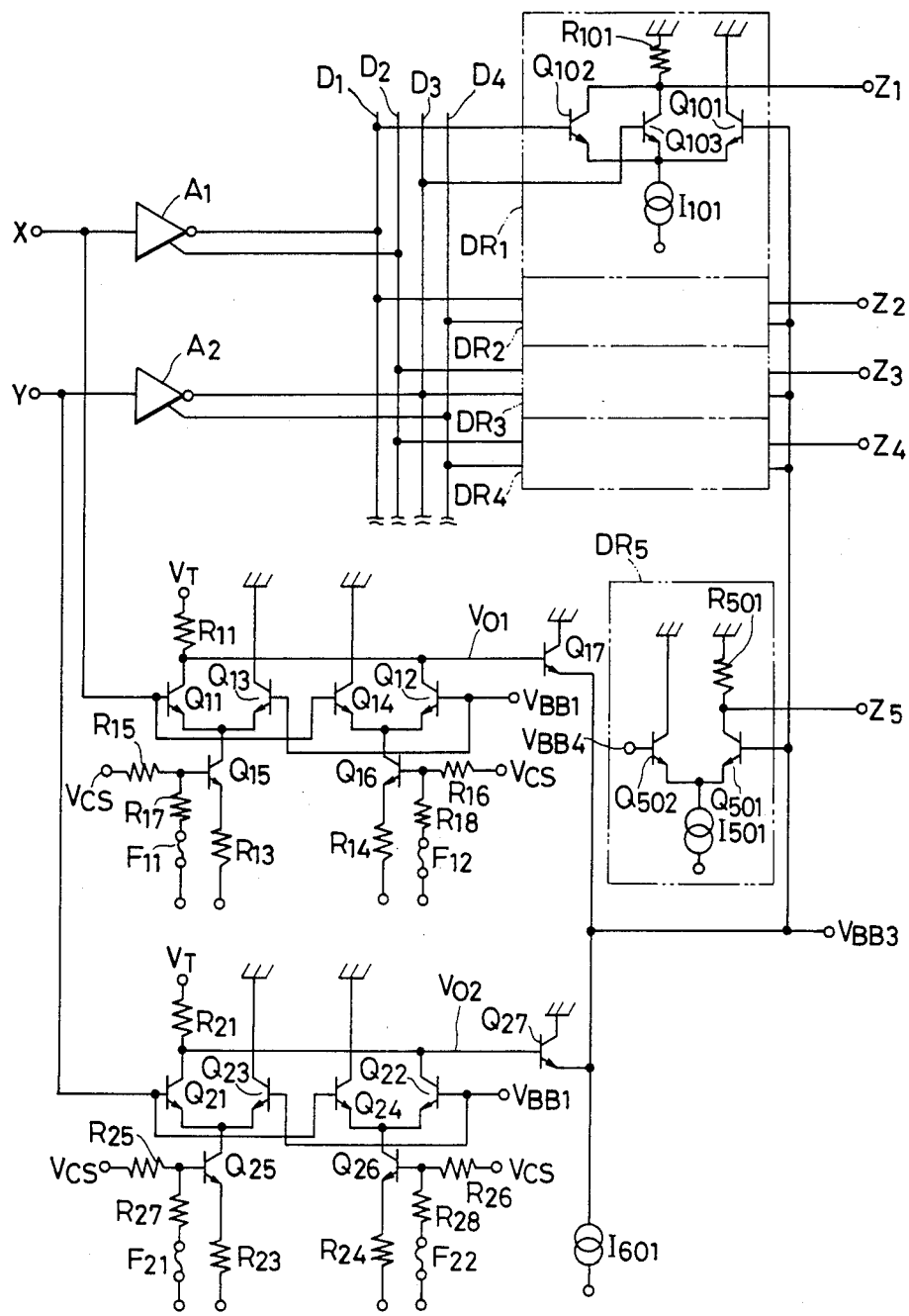
Figure 16:
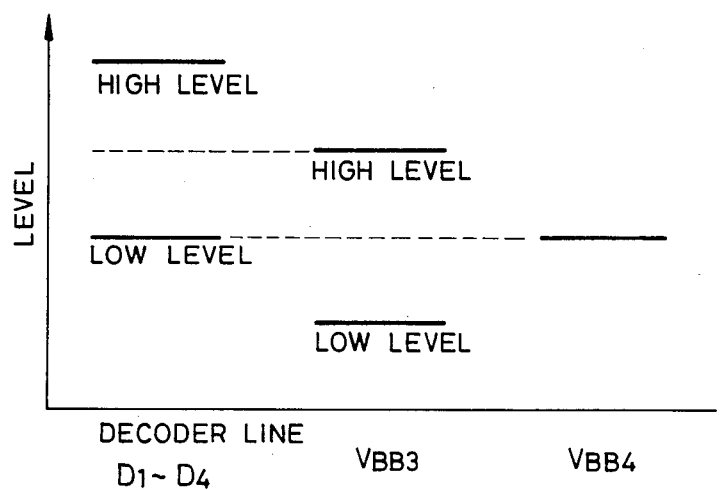

FIG. 15 is a circuit diagram showing the fourteenth embodiment of the present invention, in which a fault relief is made possible by adding a compare gate of the present invention to a bipolar ECL RAM row (or column) selecting driver circuit which is composed of address buffers $A_1$ and $A_2$, decoder lines $D_1$ to $D_4$, row (or column) driver circuits $DR_1$ to $DR_4$, and a redundant row (or column) driver circuit $DR_5$. The method of the fault relief will be described in the following by taking up a specific example. First of all, the voltage levels of the respective signals are set, as shown in FIG. 16. If, in FIG. 15, the logic levels of the address input signals to be inputted to the address buffers $A_1$ and $A_2$ are designated at X and y, respectively, the decoder lines $D_1$ to $D_4$ take logic levels $\overline{X}$, X, $\overline{Y}$ and Y, respectively. Now, if all fuses $F_{11}$, $F_{12}$, $F_{21}$ and $F_{22}$ are on, both compare gates $V_{01}$ and $V_{02}$ take the high level so that their wired OR reference potential $V_{BB3}$ also take a high level. Since this high level of the reference voltage $V_{BB3}$ is intermediate between the high and low levels of the decoder lines $D_1$ to $D_4$, as shown in FIG. 16, the row (or column) driver circuits $DR_1$ to $DR_4$ are switched in accordance with the logic levels of the decoder lines $D_1$ to $D_4$ so that signals $Z_1$ to $Z_4$ for driving the rows (or columns) take logic levels XY, X$\overline{Y}$, $\overline{X}$Y and $\overline{XY}$. Since the high level of the reference voltage $V_{BB3}$ is higher than the level of a reference voltage $V_{BB4}$, as shown in FIG. 16, on the other hand, the output signal $Z_5$ of the redundant row (or column) driver circuit $DR_5$ always takes an L (low) level. Here, if the row (or column) to be driven by the signal $Z_1$ is faulted, for example, the fuses $F_{11}$ and $F_{21}$ are cut. Thus, as has been described in connection with the embodiment of FIG. 4, both the compare gate outputs $V_{01}$ and $V_{02}$ take the low level, only when the address signals (i.e., X=High Level, Y=High Level in this case) corresponding to the fault row (or column) are inputted, so that the reference voltage $V_{BB3}$ takes the low level. Since this low level of the reference potential $V_{BB3}$ is lower than the low level of the decoder lines $D_1$ to $D_4$ and the reference voltage $V_{BB4}$, as shown in FIG. 16, all the output signals $Z_1$ to $Z_4$ of the row (or column) driver circuits $DR_1$ to $DR_4$ take the L (low) level whereas the output signal $Z_5$ of the redundant row (or column) driver circuit $DR_5$ takes the high level. In other words, the signals $Z_1$ and $Z_5$ are interchanged so that the fault row (or column) can be replaced by the redundant row (or column). Moreover, any one of the rows (or columns) driven by the signals $Z_2$ to $Z_5$ can be replaced, if faulted, by the redundant row (or column). Table 1 tabulates the fuses to be cut, in case the rows (or columns) to be deriven by the signals $Z_1$ to $Z_4$ are faulted, and the logic levels of the signals $Z_1$ to $Z_5$ in the same case.

TABLE 1

| Fault Rows (Columns) | Fuses to Be Cut | Logic Levels of Signals | | | | |
|---|---|---|---|---|---|---|
| | | $Z_1$ | $Z_2$ | $Z_3$ | $Z_4$ | $Z_5$ |
| $Z_1$ | $F_{11}, F_{21}$ | L | $X\overline{Y}$ | $\overline{X}Y$ | $\overline{XY}$ | $XY$ |
| $Z_2$ | $F_{11}, F_{22}$ | $XY$ | L | $\overline{X}Y$ | $\overline{XY}$ | $X\overline{Y}$ |
| $Z_3$ | $F_{12}, F_{21}$ | $XY$ | $X\overline{Y}$ | L | $\overline{XY}$ | $\overline{X}Y$ |
| $Z_4$ | $F_{12}, F_{22}$ | $XY$ | $X\overline{Y}$ | $\overline{X}Y$ | L | $\overline{XY}$ |

Incidentally, although the present embodiment discloses the case of one redudant row (or column), the discussion thus far made can be simply extended to the case of two or more redundant rows (or columns) by providing a plurality of the driver circuits $DR_5$ for driving the compare gates and the redundant rows (or columns). Moreover, although the present embodiment discloses the case of the two address buffers, the discussion thus far made can also be simply extended to the case of three or more address buffers. As has been described hereinbefore, according to the present embodiment, the increase in the chip area can be suppressed to a remarkably small extent because the fault relief can be realized merely by adding the fuses of small area to the insides of the compare gates in place of providing the PROM having a large area.

Embodiment 15

Figure 17:
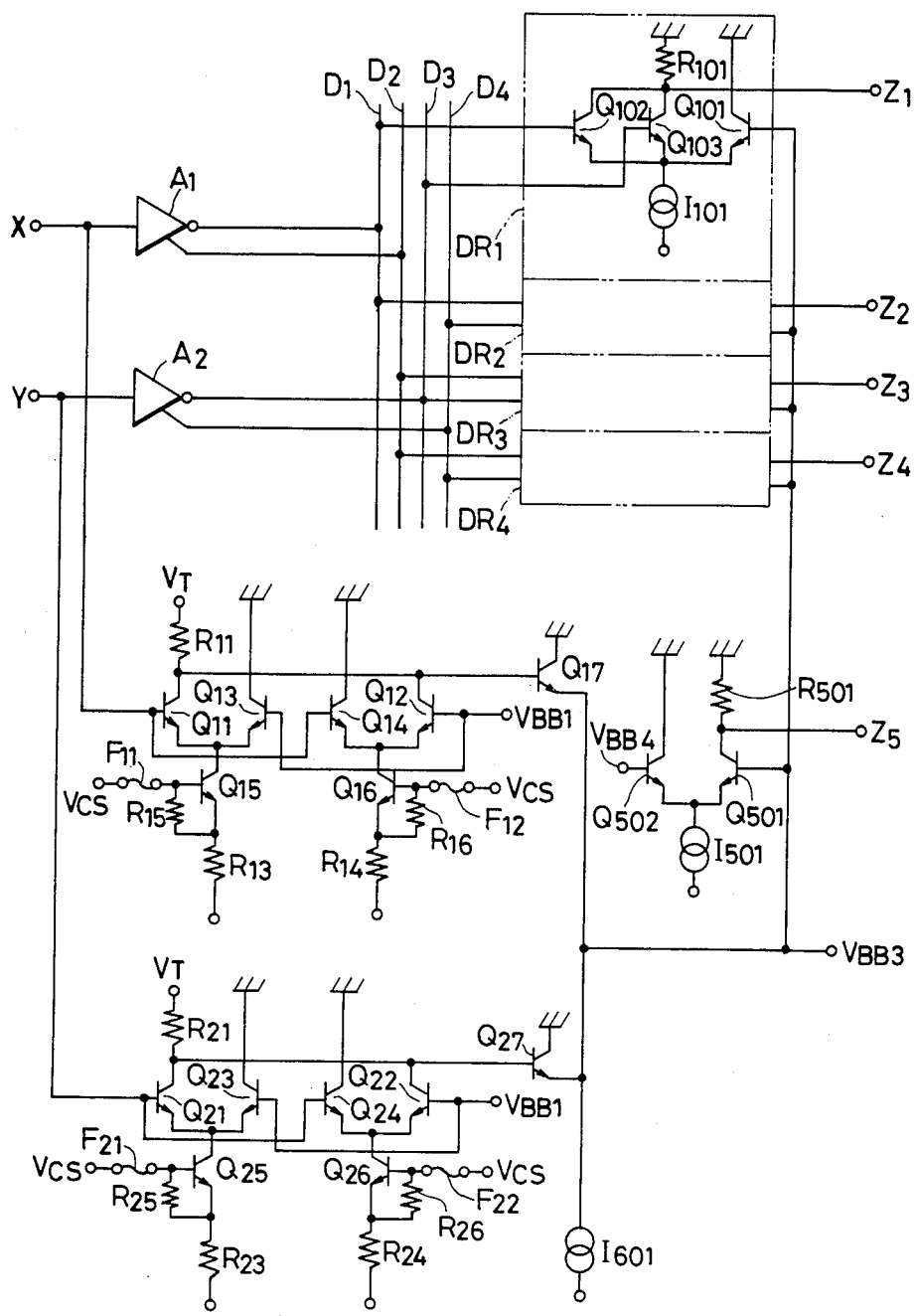

FIG. 17 is a circuit diagram showing the fifteenth embodiment of the present invention. This embodiment is different from the embodiment of FIG. 15, in which the fuses are on at first and are cut for the fault relief, only in the positions of insertion of the fuses and in that fuses are off at first and are turned on for the fault relief. As a result, the present embodiment can enjoy effects similar to those of the embodiment of FIG. 15.

Embodiment 16

Figure 18:
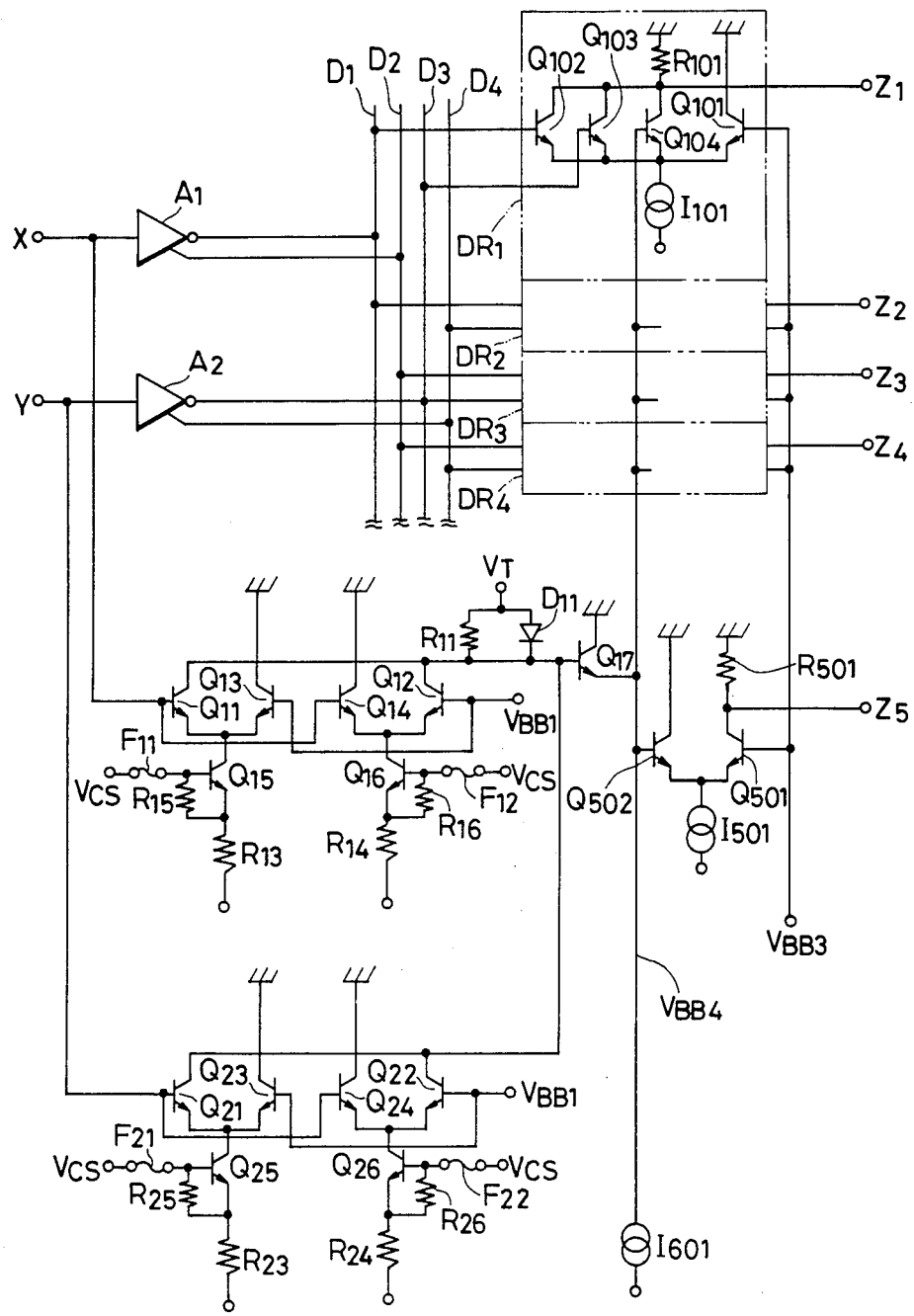

FIG. 18 is a circuit diagram showing the sixteenth embodiment of the present invention. In the embodiments of FIGS. 15 and 17, the outputs of the compare gates are dropped to the low level when the address signals corresponding to the fault row (or column) are inputted. In the present embodiment of FIG. 18, on the contrary, the aforementioned outputs are raised to the high level like the embodiment of FIG. 2. More specifically, since the reference voltage $V_{BB4}$ exceeds $V_{BB3}$ in response to the input of the address signals corresponding to the fault row (or column), both transistors $Q_{104}$ added to the insides of the row (or column) driver circuits $DR_1$ to $DR_4$ and a transistor $Q_{502}$ in the redundant row (column) driver circuit are turned on to drop the output signals $Z_1$ to $Z_4$ to the low level and to raise the signal $Z_5$ so that the fault row (or column) can be replaced by the redundant row (or column). As a result, the present embodiment can also enjoy effects similar to those of the embodiment of FIG. 15.

Embodiment 17

Figure 19:
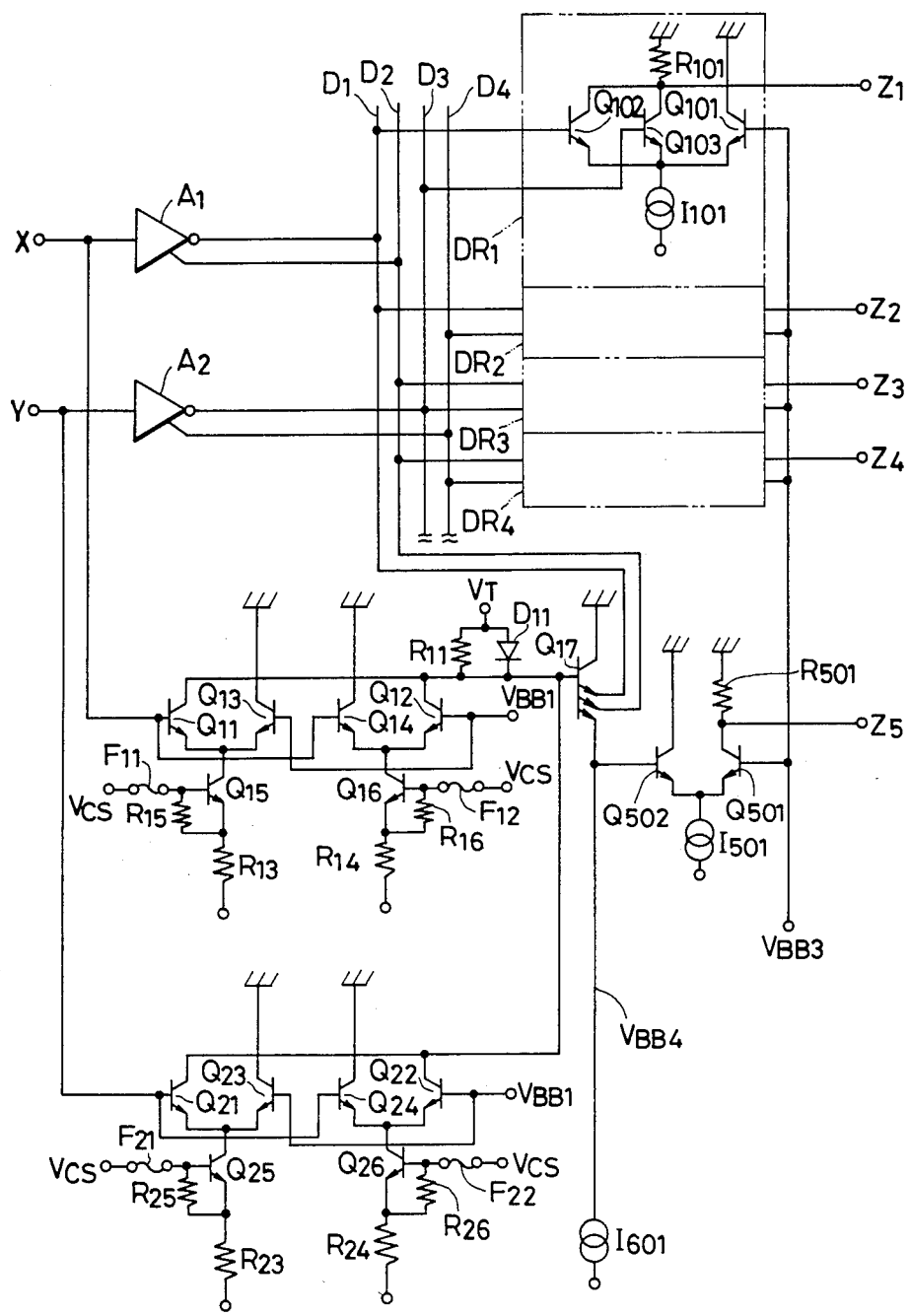

FIG. 19 is a circuit diagram showing the seventeenth embodiment of the present invention. The present embodiment is different from the embodiment of FIG. 18, in which the outputs of the compare gates are inputted to the bases of the transistors $Q_{104}$ added to the insides of the row (or column) driver circuits $DR_1$ to $DR_4$, only in that the aforementioned outputs are connected with the decoder lines $D_1$ and $D_2$ to take the wired OR logic.

As a result, the present embodiment can also enjoy effects similar to those of the embodiment of FIG. 18.

(GROUP 2)

Embodiment 18

Figure 20:
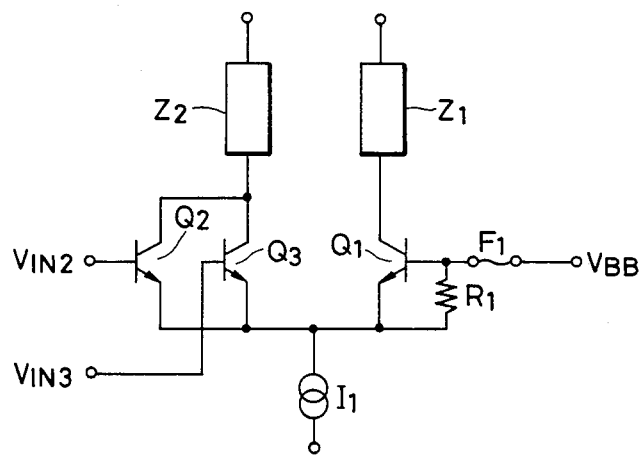
FIGS. 20 to 29 are circuit diagrams showing embodiments 18 to 26 of the present invention, respectively.

FIG. 20 is a circuit diagram showing the eighteenth embodiment of the present invention. In a current switch circuit which is composed of: a transistor $Q_1$ having its base fed with a reference voltage $V_{BB}$; transistors $Q_2$ and $Q_3$ having their bases fed with input signals $V_{IN2}$ and $V_{IN3}$ taking levels higher or lower than the reference voltage $V_{BB}$; and a current source $I_1$ connected commonly with the emitters of the transistors $Q_1$, $Q_2$ and $Q_3$, a fuse $F_1$ and a high resistor $R_1$ are additionally connected with the base of the transistor $Q_1$. Now, if the fuse $F_1$ is on, that current switch circuit switches the paths of the current $I_1$ in accordance with the levels of the input signals $V_{IN2}$ and $V_{IN3}$. When at least one of the input signals $V_{IN2}$ and $V_{IN3}$ is at the high level, more specifically, the current $I_1$ flows to a load $Z_2$. When both the input signals $V_{IN2}$ and $V_{IN3}$ are at the low level, on the contrary, the current $I_1$ flows to a load $Z_1$. If the fuse $F_1$ is cut by means of a laser beam, on the other hand, the transistor $Q_1$ receives no base current. As a result, this transistor $Q_1$ is cut off so that the current $I_1$ never fails to flow to the load $Z_2$, not matter what level the input signals $V_{IN2}$ and $V_{IN3}$ might take. Incidentally, the resistor $R_1$ is added here to set the base of the transistor $Q_1$ at the same potential as that of the emitter, when the fuse $F_1$ is cut, thereby to prevent the base voltage from floating, and is accordingly dispensable.

Embodiment 19

Figure 21:
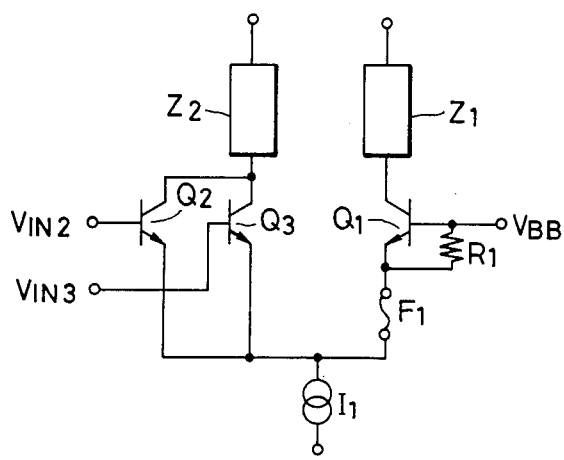

FIG. 21 is a circuit diagram showing the nineteenth embodiment of the present invention. The present embodiment of FIG. 21 is different from the embodiment of FIG. 20, in which the fuse $F_1$ is additionally connected with the base of the transistor $Q_1$, only in that the fuse $F_1$ is added to the emitter of the transistor $Q_1$. In this case, too, the transistor $Q_1$ never fails to be cut off, if the fuse $F_1$ is cut, so that the current $I_1$ never fails to flow to the load $Z_2$.

Embodiment 20

Figure 22:
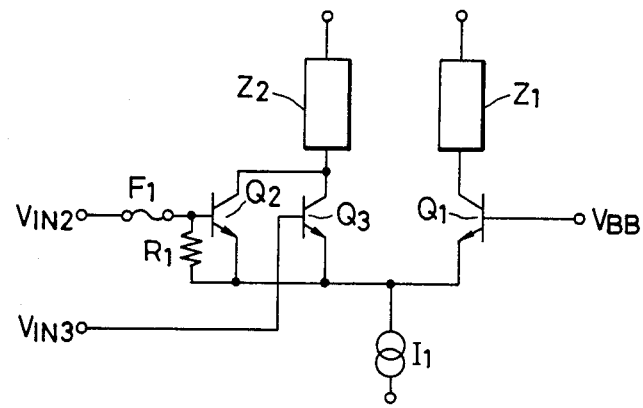

FIG. 22 is a circuit diagram showing the twentieth embodiment of the present invention. Although the fuse $F_1$ is added to the base of the transistor $Q_1$ in the embodiment of FIG. 20, the fuse $F_1$ is added to the base of the transistor $Q_2$ in the present embodiment of FIG. 22. In this embodiment, too, if the fuse $F_1$ is on, the current $I_1$ flows to the load $Z_2$, when at least one of the input signals $V_{IN2}$ and $V_{IN3}$ is at the hith level, to the load $Z_1$, when both the signals $V_{IN2}$ and $V_{IN3}$ are at the low level, like the embodiment of FIG. 20. When the fuse $F_1$ is cut, on the other hand, the transistor $Q_2$ is cut off no matter what level the input signal $V_{IN2}$ might take. As a result, the current switch circuit switches the flow paths of the current $I_1$ exclusively according to the level of the input signal $V_{IN3}$. In other words, the current $I_1$ flows to the load $Z_2$, when the input signal $V_{IN3}$ is at the high level, and to the load $Z_1$ when the signal $V_{IN3}$ is at the low level.

Embodiment 21

Figure 23:
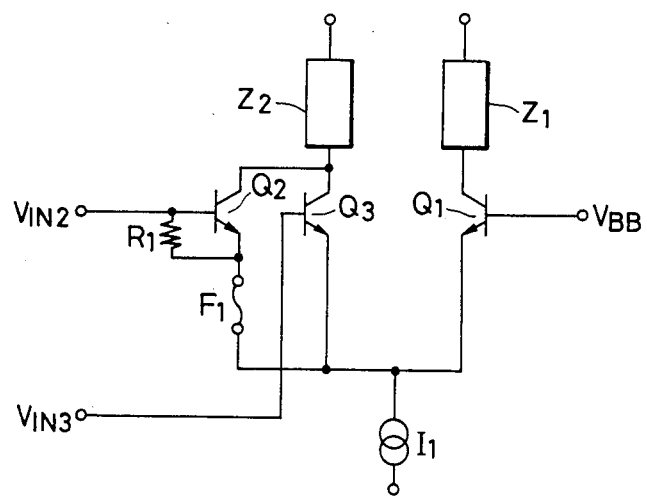

FIG. 23 is a circuit diagram showing the twenty-first embodiment of the present invention. The present embodiment of FIG. 23 is different from the embodiment of FIG. 22, in which the fuse $F_1$ is added to the base of the transistor $Q_2$, only in that the fuse $F_1$ is added to the emitter of the transistor $Q_2$. The operations of the current switch circuit are absolutely the same as those in the case of the embodiment of FIG. 22.

Embodiment 22

Figure 24:
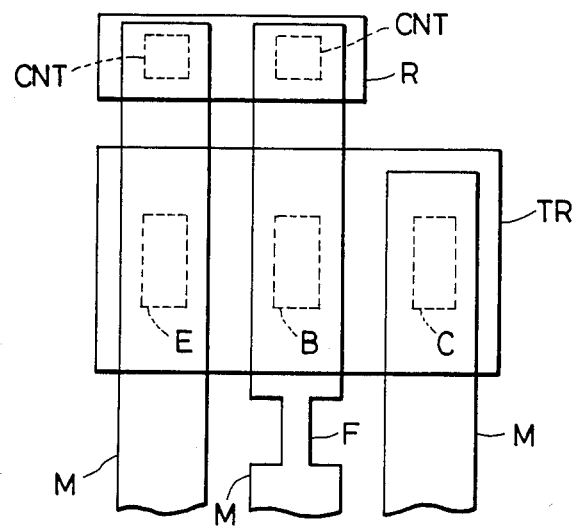

FIG. 24 is a diagram showing the twenty-second embodiment of the present invention and a layout showing a method of adding the fuse to the base of the transistor and the resistor between the base and emitter of the same transistor, as shown in FIGS. 20 and 22. In FIG. 24: reference letters TR designate a transistor; letter E an emitter; letter B a base; letter C a collector; letter R a resistor; letters CNT a contact; and letter M a metal for signal line. Designated here at letter F is a fuse which uses the signal line metal as it is.

Embodiment 23

Figure 25:
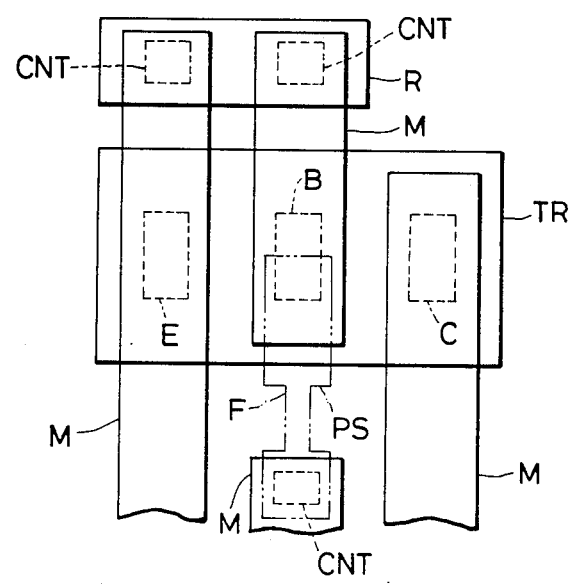

FIG. 25 is a diagram showing the twenty-third embodiment of the present invention and a layout showing a method of adding the fuse to the base of the transistor and the resistor between the base and emitter of the same transistor like the embodiment of FIG. 24. Although the fuse F is made of the signal line metal in the embodiment of FIG. 24, it is made of poly-silicon PS in the embodiment of FIG. 25.

Embodiment 24

Figure 26:
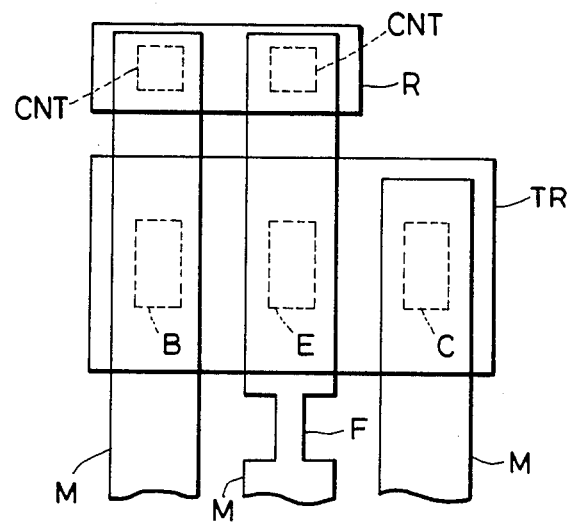

FIG. 26 is a diagram showing the twenty-fourth embodiment of the present invention and a layout showing a method of adding the fuse to the emitter of the transistor and the resistor between the base and emitter of the same transistor, as shown in FIGS. 21 and 23. Here, the fuse F uses the signal line metal as it is like the embodiment of FIG. 24.

Embodiment 25

Figure 27:
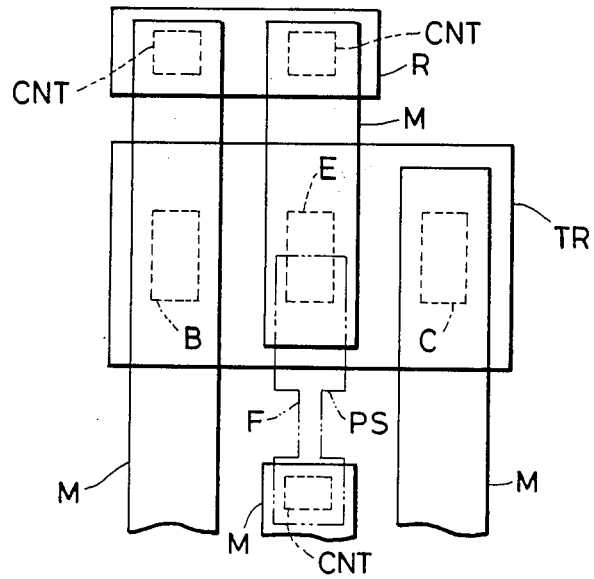

FIG. 27 is a diagram showing the twenty-fifth embodiment of the present invention and a layout of adding the fuse to the emitter of the transistor and the resistor between the base and emitter of the same transistor like the embodiment of FIG. 26. Here, the fuse F is made of poly-silicon PS like the embodiment of FIG. 25.

Embodiment 26

Figure 28:
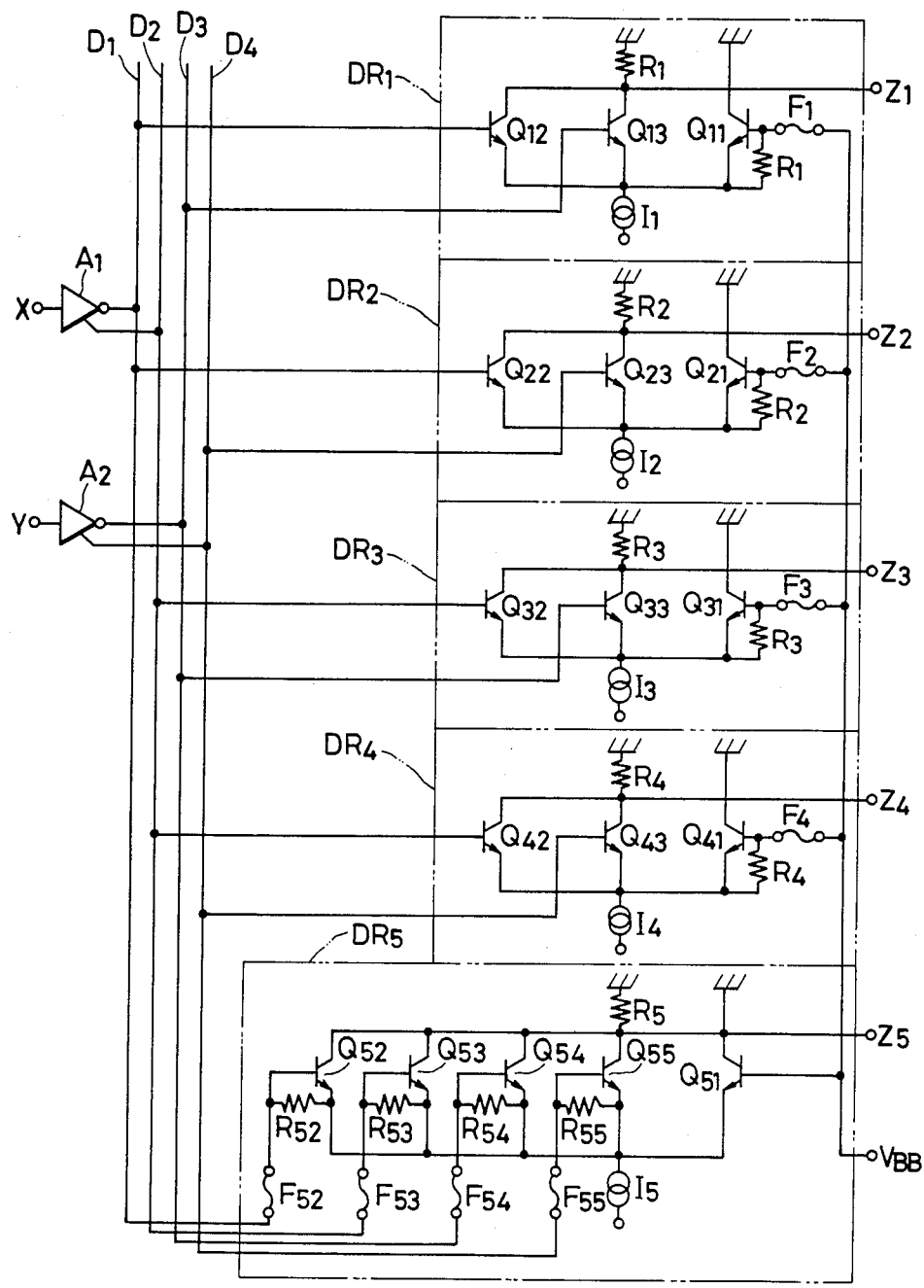

FIG. 28 is a circuit diagram showing the twenty-sixth embodiment of the present invention, in which a fault relief is made possible by applying the present invention to a bipolar ECL RAM row (or column) selecting driver circuit which is composed of address buffers $A_1$ and $A_2$, decoder lines $D_1$ to $D_4$, row (or column) driver circuits $DR_1$ to $DR_4$, and a redundant row (or column) driver circuit $DR_5$. The method of the fault relief will be described in the following by taking up a specific example. If, in FIG. 28 the logic levels of the address input signals to be inputted to the address buffers $A_1$ and $A_2$ are designated at X and Y respectively, the decoder lines $D_1$ to $D_4$ take logic levels $\overline{X}$, X, $\overline{Y}$ and Y, respectively. Now, if all fuses $F_1$ to $F_4$ and $F_{52}$ to $F_{55}$ are on, signals $Z_1$ to $Z_5$ for driving the rows (or columns) take logic levels XY, $X\overline{Y}$, $\overline{X}Y$, $\overline{XY}$ and L (i.e., the low level) because the row (or column) driver circuits $DR_1$ to $DR_5$ construct a NOR logic gate. Here, if the row (or column) to be driven by the signal $Z_1$ is faulted, for example, the fuses $F_1$, $F_{53}$ and $F_{55}$ are cut. Since, at this time, the transistors $Q_{11}$, $Q_{53}$ and $Q_{55}$ never fail to be cut off, the signal $Z_1$ takes the logic level L, and the signal $Z_5$ takes the logic level XY because the signals to be inputted to the row (or column) driver circuit $DR_5$ are $\overline{X}$ and $\overline{Y}$. In other words, the signals $Z_1$ and $Z_5$ are interchanged so that the fault row (or column) can be replaced by the redundancy row (or column). Moreover, any one of the rows (or columns) driven by the signals $Z_2$ to $Z_4$ can be replaced, if faulted, by the redundant row (or column). Table 2 tabulates the fuses to be cut, in case the rows (or columns) to be driven by the signals $Z_1$ to $Z_4$ are faulted, and the logic levels of the signals $Z_1$ to $Z_5$ in the same case.

TABLE 2

| Fault Rows (Columns) | Fuses to Be Cut | Logic Levels of Signals | | | | |
|---|---|---|---|---|---|---|
| | | $Z_1$ | $Z_2$ | $Z_3$ | $Z_4$ | $Z_5$ |
| $Z_1$ | $F_1$, $F_{53}$, $F_{55}$ | L | $X\overline{Y}$ | $\overline{X}Y$ | $\overline{XY}$ | XY |
| $Z_2$ | $F_2$, $F_{53}$, $F_{54}$ | XY | L | $\overline{X}Y$ | $\overline{XY}$ | $X\overline{Y}$ |
| $Z_3$ | $F_3$, $F_{52}$, $F_{55}$ | XY | $X\overline{Y}$ | L | $\overline{XY}$ | $\overline{X}Y$ |
| $Z_4$ | $F_4$, $F_{52}$, $F_{54}$ | XY | $X\overline{Y}$ | $\overline{X}Y$ | L | $\overline{XY}$ |

Incidentally, although the present embodiment discloses the case of one redundant row (or column), the discussion thus far made can be simply extended to the case of two or more redundancy rows (or columns) by providing a plurality of the driver circuits $DR_5$ for driving the redundant rows (or columns). Moreover, although the present embodiment discloses the case of the two address buffers, the discussion thus far made can also be simply extended to the case of three or more address buffers. As has been described Hereinbefore, according to the present embodiment, the increase in the chip area can be suppressed to a remarkably small extent because the fault relief can be realized merely by adding the fuses of small area to the insides of the row (or column) driver circuits in place of providing the compare gates having a large area.

Figure 29:
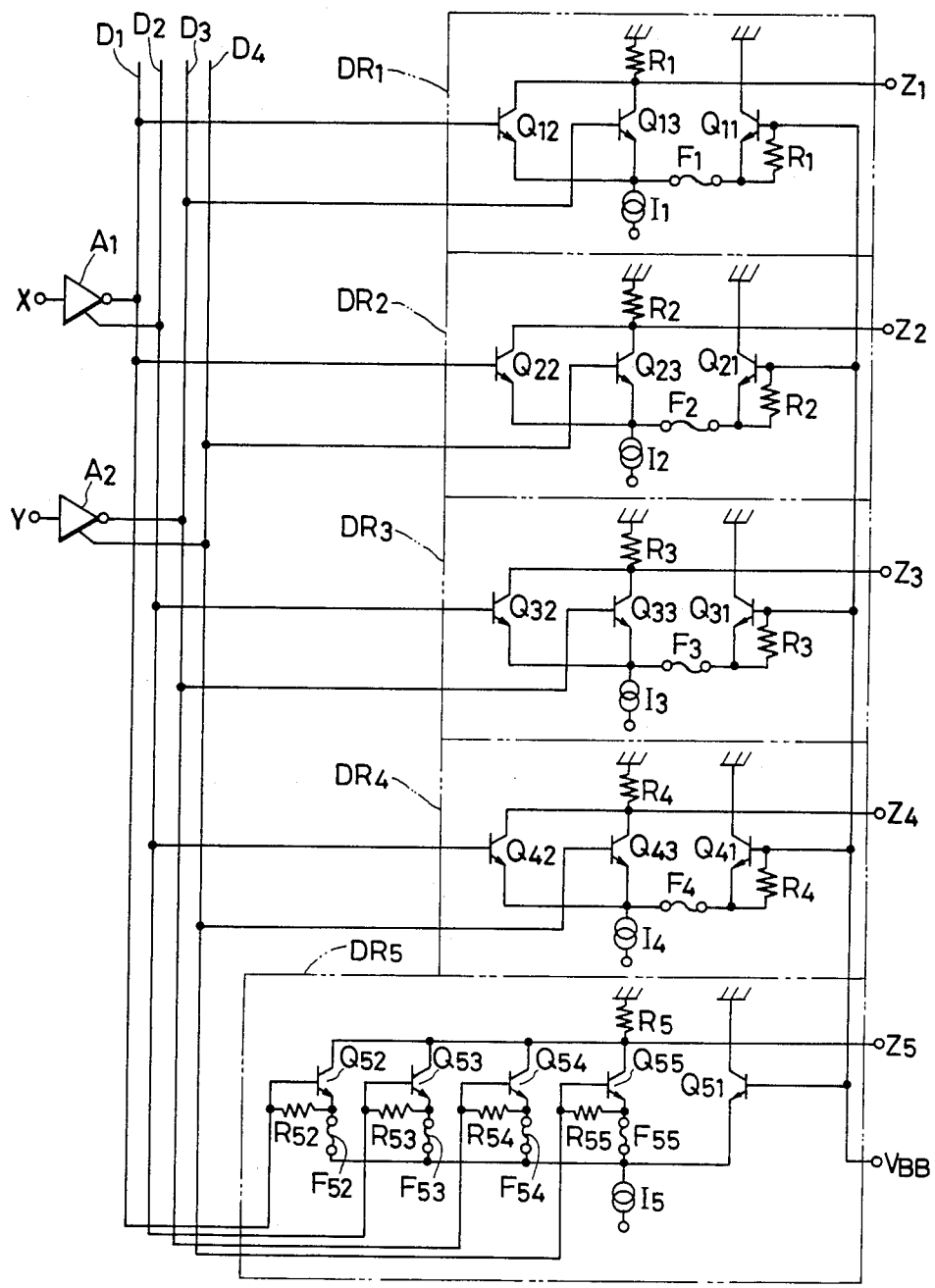

FIG. 29 is a circuit diagram showing the twenty-sixth embodiment of the present invention. The present embodiment of FIG. 29 is different from the embodiment of FIG. 28, in which the fuses $F_1$ to $F_4$ and $F_{52}$ to $F_{55}$ are added to the bases of the transistors $Q_{11}$ to $Q_{41}$ and $Q_{52}$ to $Q_{55}$, only in that the aforementioned fuses are added to the emitters of the aforementioned transistors. As a result, the present embodiment can also enjoy effects similar to those of the embodiment of FIG. 28.

(GROUP 3)

Figure 30:
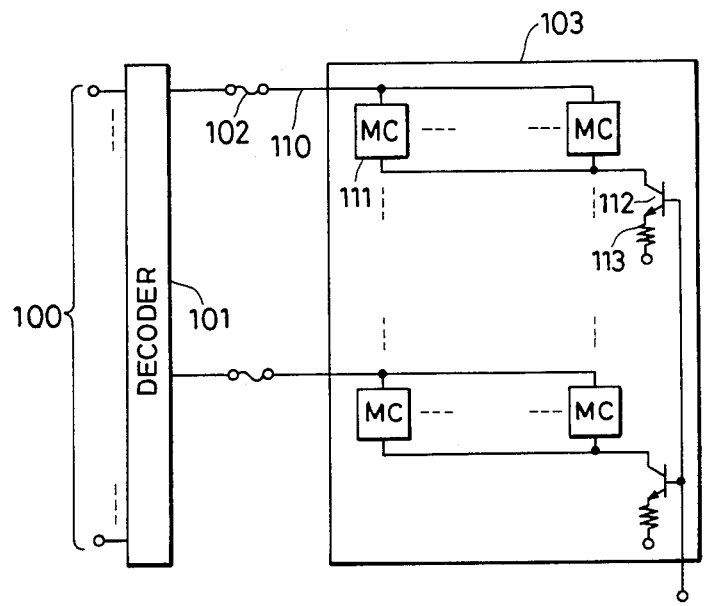
FIGS. 30 to 39 are circuit diagrams showing embodiments 27 to 32 of the present invention, respectively.

The structure of the semiconductor memory having redundancy is devised for the memory which is composed mainly of MOSes. The following problems arise if that structure is applied as it is to the bipolar RAM. These problems will be described with reference to FIG. 30. In the bipolar memory, a holding current has to be supplied to the memory cells so as to hold the data stored in the memory cells. For this necessity, each line is equipped with a current source which is composed of a transistor 112 and a resistor 113. Now, let it be assumed that a memory cell connected with a word line 110, e.g., a memory cell 111 is a fault bit to cut a fuse 102. In this case, the word line 110 comes into the floating state so that the collector current of the transistor 112 composing the current source is not supplied anywhere to drop the voltage of the word line 110 so that the transistor 112 is saturated. If a transistor in the bipolar integrated circuit is saturated, generally speaking, a current will flow into the semiconductor substrate to raise a problem that the electric insulation between the elements cannot be maintained.

Moreover, since a large current (e.g., a hold current, a read current or a word line discharge current) will flow through the word lines of the bipolar memory, it is difficult to connect the fuses directly with the word lines.

This makes it difficult to apply the structure of the prior art as it is to the bipolar memory.

An object of the embodiments belonging to the group 3 is to provide a memory circuit having such redundancy as is suitable for the bipolar memory.

This object can be achieved by connecting a low clamp circuit and a fuse with the base of an output emitter-follower of a circuit for selectively driving the row (or column) of a body memory.

By connecting the low clamp circuit with the base of the output emitter-follower for selectively driving the row (or column) of the body memory, the voltage of the fault row (or column) isolated can be clamped at a normal unselected voltage. This makes it possible to solve the aforementioned problem of saturation of the transistor. By connecting the fuse with the base of the aforementioned emitter-follower, moreover, the current to flow through the fuse can be dropped to 1/(current amplification factor) of that to flow through the row (or column) of the body memory.

Embodiment 27

Figure 31:
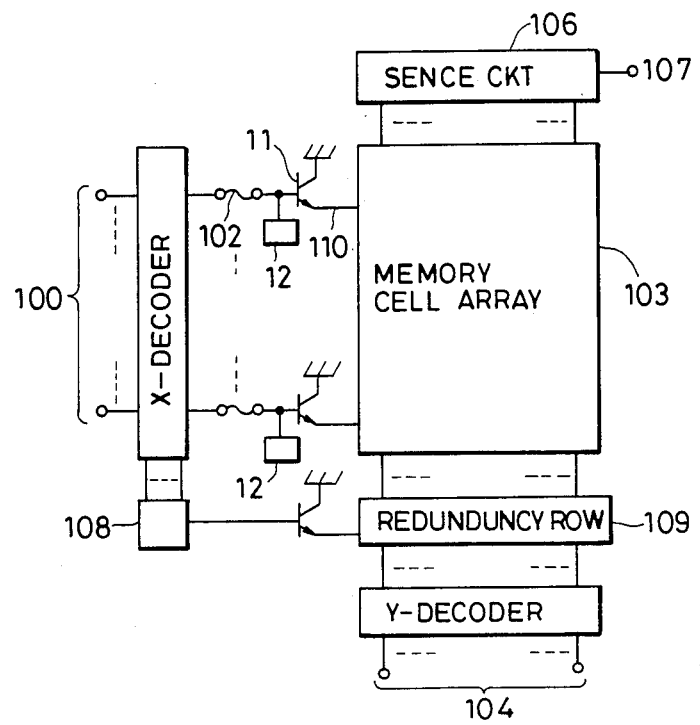

FIG. 31 is a diagram showing the twenty-seventh embodiment of the present invention. a row address signal 100 and a column address signal 104 are decoded by a row decoder 101 and a column decoder 105, respectively, to select one of the memory cells of a body memory 103. A read signal from the memory cell selected is sensed by a sense circuit 106 so that a data output signal 107 is outputted. In case a fault bit is found in the body memory 103, on the other hand, a fuse 102, which is connected with the base of an emitter-follower 11 for driving a word line connected with the fault bit, e.g., a word line 110, is cut at first by means of a laser beam so that the fault bit may not be selected. Next, a spare decoder 108 is programmed so that a spare row 109 may be selected in response to an address signal for selection of the fault memory cell. Since the low clamp circuit is connected with the base of the emitter-follower for driving the word lines, according to the present invention, the word line 110 isolated is caused to take the normal unselected voltage by the low clamp circuit 12 so that the transistor of the current source for the holding current is freed from any saturation.

Embodiment 28

Figure 32:
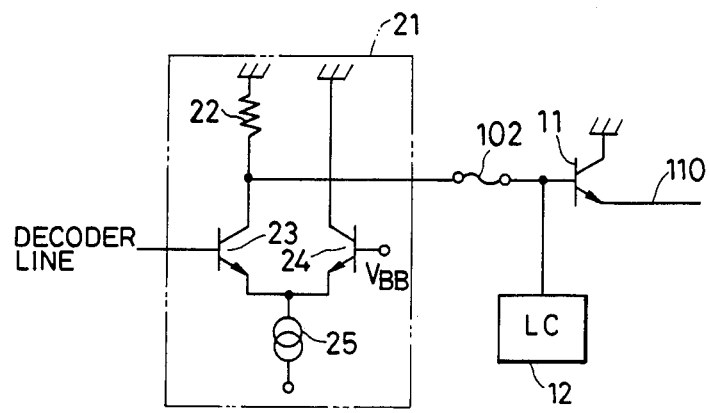

FIG. 32 is a circuit diagram showing the twenty-eighth embodiment of the present invention, which is applied to a wired OR type decoder. This wired OR decoder 21 is composed of a load 22, transistors 23 and 24 and a current source 25. The transistor 23 has its base connected with a decode line so that the word line 110 takes a high voltage and comes into a selected state only when the voltage of the decode line is lower than a reference voltage $V_{BB}$.

Designated at reference numeral 12 is a low clamp circuit which is used to clamp the voltage of the word line 110 at the normal unselected level when the fuse 102 is cut.

Embodiment 29

Figure 33:
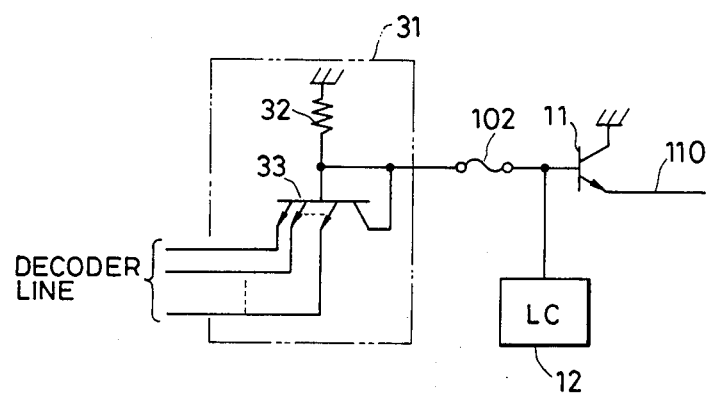

FIG. 33 is a circuit diagram showing the twenty-ninth embodiment of the present invention, which is applied to a transistor gate type decoder. This transistor gate type decoder 31 is composed of a load 32 and a multi-emitter transistor 33. This transistor 33 has its emitter connected with a decode line so that the word line rises to a high voltage and comes into a selected state only when all the decode lines connected with that emitter are at a high voltage. The transistor gate type decoder can conduct high-speed operations because they have a smaller number of logic stages than that of the aforementioned wired OR type decoder.

Embodiment 30

Figure 34:
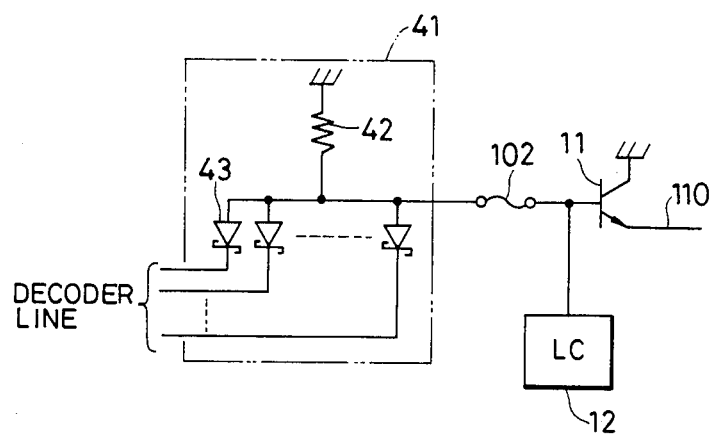

FIG. 34 is a circuit diagram showing the thirtieth embodiment of the present invention, which is applied to an SBD (which is the abbreviation of "Schottky Barrier Diode") type decoder. This SBD type decoder 41 is constructed by replacing the multi-emitter transistor 33 of the aforementioned transistor gate type decoder by an SBD 43 and has the same operations as those of the transistor type decoder so that the word line 110 comes its selected state only when all the decode lines 110 are at the high voltage. Because of the use of the SBD 43, the SBD type decoder 41 has a small capacitance connected with a load 42 so that it can operate at a higher speed than the transistor gate type decoder. The operations can be speeded up better than the embodiment of FIG. 33 by applying the present invention to the SBD type decoder.

Embodiment 31

Figure 35:
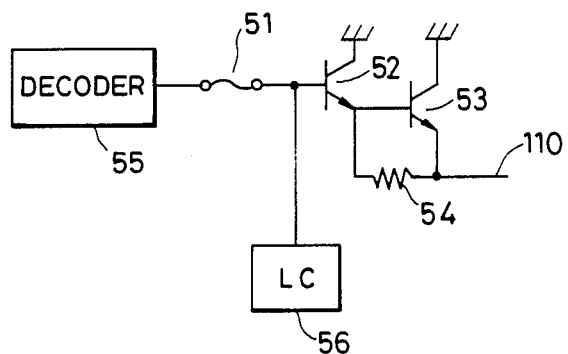
Figure 36:
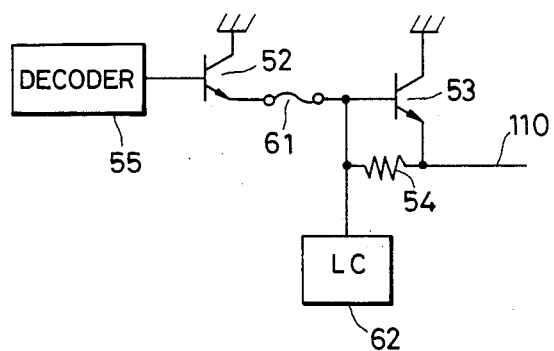

FIGS. 35 and 36 are circuit diagrams showing the thirty-first embodiment of the present invention, which is applied to a Darlington type driver. This Darlington type driver is composed of two-stages of emitter-followers 52 and 53, and a resistor 54. Designated at reference numeral 55 is a decoder which may be any of the decoders of FIGS. 32 to 34. The operations can be further speeded up because the Darlington type driver has a higher load driving ability than that of the emitter-follower type drivers used in the embodiments of FIGS. 31 to 34. FIG. 35 shows an example in which a fuse 51 is connected with the base of the first-stage emitter-follower 52. The method of not selecting the fault memory cell is effected by cutting the fuse 51 like the case of the aforementioned emitter-follower type drivers. FIG. 36 shows an example in which a fuse 61 is connected with the base of the second-stage emitter-follower 53. Incidentally, numerals 56 and 62 designate low clamp circuits.

Embodiment 32

Figure 37:
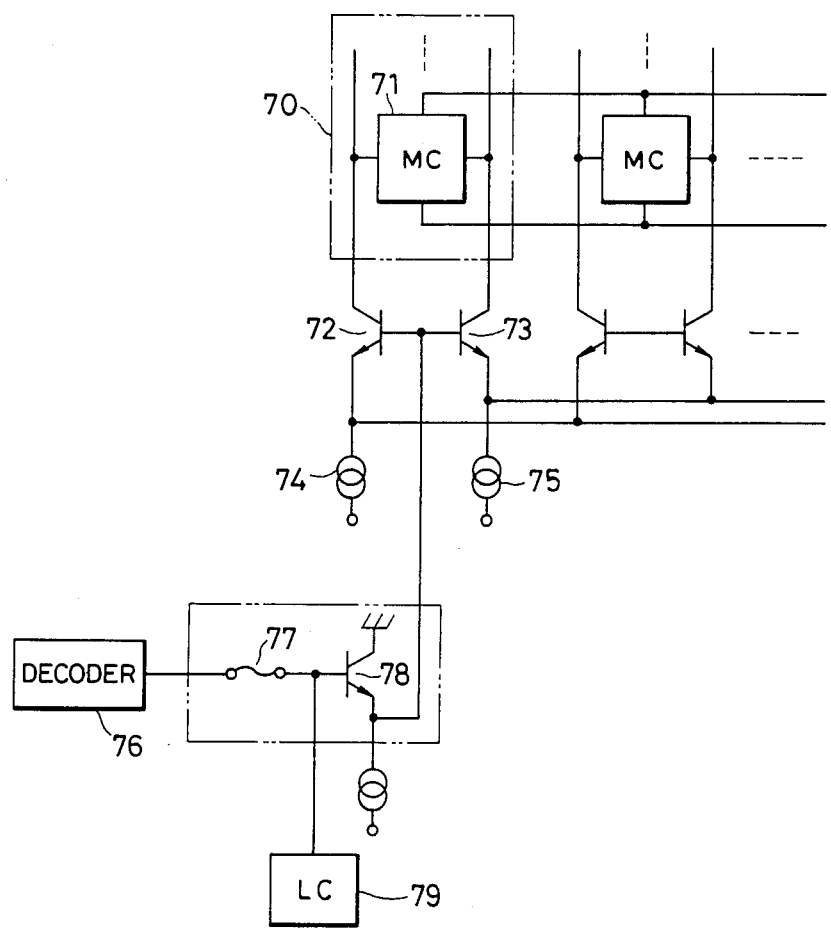

Although the embodiments thus far described are applied to the circuit for selectively driving the rows of the memory cell array, the present invention can be applied to a circuit for selectively driving the columns. This circuit is exemplified by FIG. 37. When the output of a decoder 76 is at a high voltage the bases of read current switch transistors 72 and 73 take the high voltage to allow a read current to flow through the transistors 72 and 73 so that a column 70 is selected. In case a fault is found in a memory cell belonging to the column 70, e.g., a memory cell 71, a fuse 77 connected with the base of an emitter-follower 78 is cut so that the column 70 may not be selected. Incidentally, reference numeral 79 designates a low clamp circuit for clamping the base of the emitter-follower 78 at a normal unselected voltage when the fuse 77 is cut.

Embodiment 33

Figure 38:
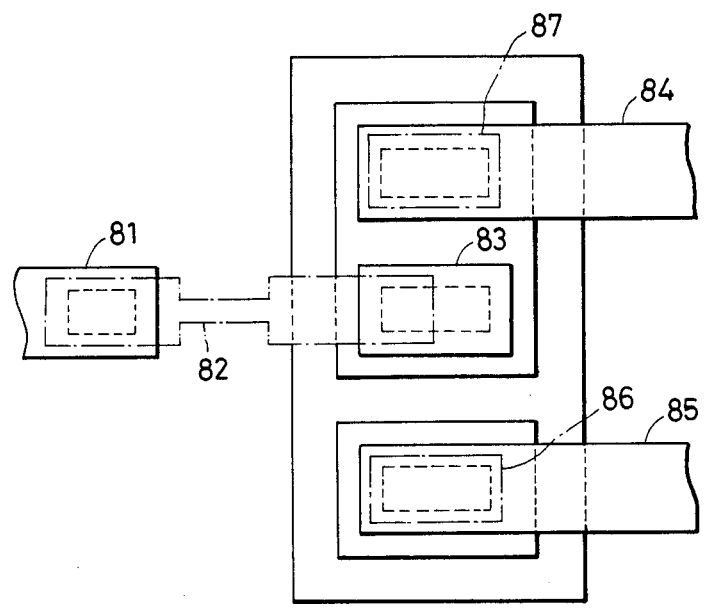

FIG. 38 is a diagram showing the embodiment in case the present invention is realized in a practical semiconductor. In this embodiment, a fuse 82 is made of poly-silicon. This fuse 82 has its one end connected with a base electrode 83 and its other end connected with a decoder output 81. Incidentally, numerals 84 and 85 designate an emitter electrode and a collector electrode, respectively. Moreover, no new step has to be added if the fuse 82 is formed simultaneously with poly-silicon regions 86 and 87 on the collector and emitter. It is quite possible that the fuse 82 can be formed separately of the poly-silicon regions 86 and 87 on the collector and emitter.

Embodiment 34

Figure 39:
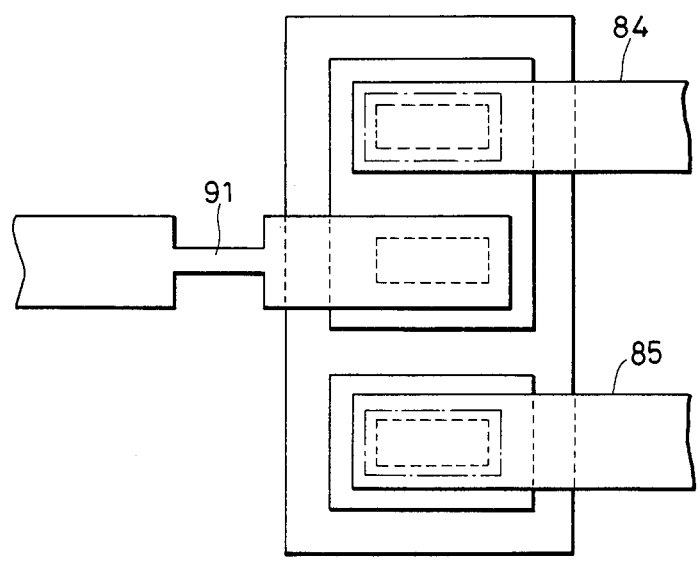

FIG. 39 is a diagram showing the embodiment in which a fuse is made of metal for signal line. Although the fuse 91 is formed of a first-layered wiring in FIG. 39, it may be formed of a second or third wiring in case a multi-layered wiring is used.

According to the present invention, the potential of the fault row (or column) isolated can be clamped at the normal unselected voltage. Since no high current will flow through the fuse, moreover, it is possible to provide a memory circuit having redundancy suitable for the bipolar memory.

As has been described hereinbefore, according to the present invention, the fault relief of the bipolar ECL RAM having redundant rows (or columns) can be realized not by using the PROM occupying a large area on the chip but merely by adding the fuses of remarkably small area to the insides of the compare gates.

According to the present invention, moreover, since neither signal delay nor compare time is required, it is possible to provide a memory which is excellent in its high-speed operations.

According to the present invention, still moreover, since the fault row is electrically fixed, it is possible to provide a stable memory.

It is further understood by those skilled in the art that the foregoing description is directed to the preferred embodiments of the disclosed invention and that various changes and modifications may be made in the invention without departing from the spirit and scope thereof.

What is claimed is:

1. A bipolar memory having redundancy, comprising:
   a memory array including bipolar memory cells;
   a redundancy row including at least one row of memory cells;
   an address buffer made receptive of an address signal;
   decoder means made receptive of said address signal for selecting said memory array; and
   redundancy row selecting means including: first and second bipolar transistors having their bases made receptive of said address signal; third and fourth bipolar transistors having their emitter electrodes connected with the emitters of the first and second bipolar transistors and their bases made receptive of a reference voltage; and a current source having fuses connected with said emitter electrodes, respectively, so that a redundancy row selection signal may be outputted from the collectors of said first and third bipolar transistors or said second and fourth bipolar transistors,
   whereby said fuses are cut so that the selection signal may be outputted when said address signal indicates the address of a fault row.

2. A bipolar memory according to claim 1, wherein said current source having fuses further has fifth and sixth bipolar transistors having their bases connected with said fuses.

3. A bipolar memory according to claim 2, wherein resistors are connected between the bases and emitters of said fifth and sixth bipolar transistors.

4. A bipolar memory according to claim 3, wherein said fuses are made of poly-silicon.

5. A bipolar memory according to claim 1, wherein said current source having fuses further has fifth and sixth bipolar transistors having their emitters connected with said fuses.

6. A bipolar memory according to claim 5, wherein resistors are connected between the bases and emitters of said fifth and sixth bipolar transistors.

7. A bipolar memory according to claim 1, wherein said current source having fuses further has fifth and sixth bipolar transistors such that fuses are connected in series with resistors between the bases and emitters of said fifth and sixth bipolar transistors.

8. A bipolar memory according to claim 1, wherein said current source having fuses further has fifth and sixth bipolar transistors having their bases connected with fuses and further their emitters connected with a common internal current source.

9. A bipolar memory according to claim 8, wherein said fuses are made of poly-silicon.

10. A bipolar memory having redundancy, comprising:
    a memory array including bipolar memory cells;
    a redundancy row including at least one row of memory cells;
    an address buffer made receptive of an address signal;
    decoder means made receptive of said address signal for selecting said memory array; and
    redundancy row selecting means including: first and second bipolar transistors having at least their bases made receptive of said address signal corresponding to an address number; a third bipolar transistor having its emitter electrode connected with the emitters of the first and second bipolar transistors and its base made receptive of a reference voltage; and a current source connected with the emitters of said first, second and third bipolar transistors and the bases or emitters of said first and second or third bipolar transistor are provided with fuses so that the redundancy row selection signal may be outputted from the collectors of said first, second and third bipolar transistors,
    whereby said fuses are cut so that said selection signal may be outputted when said address signal indicates the address of a fault row.

11. A bipolar memory according to claim 10, wherein said fuses are made of poly-silicon, and wherein resistors are connected between the bases and emitters of said first and second or third bipolar transistors.

12. A bipolar memory according to claim 11, wherein said fault row is equipped with voltage stabilization means.

13. A bipolar memory according to claim 11, wherein said fault row is isolated from the row selection means and is equipped with voltage stabilization means.

14. A bipolar memory having redundancy, comprising:
- a memory array including bipolar memory cells;
- a redundancy row including at least one row of memory cells;
- an address buffer made receptive of an address signal;
- decoder means made receptive of said address signal for selecting said memory array; and
- redundancy row selecting means including: first and second bipolar transistors having their bases made receptive of said address signal; third and fourth bipolar transistors having their emitter electrodes connected with the emitters of the first and second bipolar transistors and their bases made receptive of a reference voltage; and a current source having fuses connected with said emitter electrodes, respectively, so that a redundancy row selection signal may be outputted from the collectors of said first and third bipolar transistors or said second and fourth bipolar transistors,
wherein said fault row is isolated from said row selection means,
wherein said fault row is equipped with voltage stabilization means, and
wherein said fuses are made of poly-silicon,
whereby said fuses are cut so that the selection signal may be outputted when said address signal indicates the address of a fault row.7

* * * * *